(12) United States Patent
Yoshida

(10) Patent No.: US 8,081,049 B2
(45) Date of Patent: Dec. 20, 2011

(54) BAND-PASS FILTER DEVICE, METHOD OF MANUFACTURING SAME, TELEVISION TUNER, AND TELEVISION RECEIVER

(75) Inventor: Hiroshi Yoshida, Kanagawa (JP)

(73) Assignee: Sony Corporation, Tokyo (JP)

( * ) Notice: Subject to any disclaimer, the term of this patent is extended or adjusted under 35 U.S.C. 154(b) by 365 days.

(21) Appl. No.: 12/403,914

(22) Filed: Mar. 13, 2009

(65) Prior Publication Data

US 2009/0237180 A1 Sep. 24, 2009

(30) Foreign Application Priority Data

Mar. 18, 2008 (JP) ................. 2008-068965

(51) Int. Cl.
*H03H 9/70* (2006.01)
*H03H 9/54* (2006.01)
*H03H 3/02* (2006.01)
*H04N 5/50* (2006.01)
*H03J 3/02* (2006.01)
(52) U.S. Cl. ........ 333/133; 333/188; 333/189; 333/190; 29/26.35; 29/594; 348/731; 334/41
(58) Field of Classification Search .................. 333/133, 333/187–192; 455/82–83; 29/25.35, 594; 348/725, 731; 334/41, 42
See application file for complete search history.

(56) References Cited

U.S. PATENT DOCUMENTS

| | | | | |
|---|---|---|---|---|
| 6,049,702 A * | 4/2000 | Tham et al. | ....................... | 455/78 |
| 6,204,737 B1 * | 3/2001 | Ella | ................ | 333/187 |
| 6,266,329 B1 * | 7/2001 | Lazaris-Brunner et al. | .. | 370/316 |
| 6,441,703 B1 * | 8/2002 | Panasik | ........................ | 333/189 |
| 6,486,751 B1 * | 11/2002 | Barber et al. | ................. | 333/187 |
| 6,703,763 B2 * | 3/2004 | Tsai et al. | ..................... | 310/318 |
| 6,870,446 B2 * | 3/2005 | Ohara et al. | ................... | 333/188 |
| 7,301,260 B2 * | 11/2007 | Kawakubo | .................... | 310/324 |
| 7,486,003 B1 * | 2/2009 | Jang | .............................. | 310/320 |
| 7,586,391 B2 * | 9/2009 | Volatier et al. | ................ | 333/188 |

(Continued)

FOREIGN PATENT DOCUMENTS

JP 55-050720 4/1980

(Continued)

OTHER PUBLICATIONS

Piazza, G. et al., "One and Two Port Piezoelectric Contour-Mode MEMS Resonators for Frequency Synthesis," Solid-State Device Research Conference, ESSDERC 2006, pp. 182-185, 2006.

(Continued)

*Primary Examiner* — Barbara Summons
(74) *Attorney, Agent, or Firm* — K&L Gates LLP

(57) ABSTRACT

A band-pass filter device includes: a plurality of band-pass filter elements on a principal plane of a substrate; wherein the band-pass filter elements correspond to a plurality of respective channels divided by frequency regions, and each have a plurality of piezoelectric resonators. Each of the piezoelectric resonators includes a piezoelectric film whose periphery is supported by the substrate, a first electrode formed on a lower surface of the piezoelectric film, a second electrode formed on an upper surface of the piezoelectric film and formed in a state of overlapping at least a part of the first electrode with the piezoelectric film interposed between the second electrode and the first electrode, a lower space formed between the substrate and the piezoelectric film, and an upper space formed over the piezoelectric film.

15 Claims, 29 Drawing Sheets

U.S. PATENT DOCUMENTS

| | | | |
|---|---|---|---|
| 7,756,500 B1 * | 7/2010 | Fulga et al. | 455/266 |
| 2003/0067368 A1 | 4/2003 | Ohara et al. | |
| 2004/0207291 A1 * | 10/2004 | Mehta | 310/320 |
| 2007/0182510 A1 | 8/2007 | Park et al. | |

FOREIGN PATENT DOCUMENTS

| | | |
|---|---|---|
| JP | 2003-168955 | 6/2003 |
| JP | 2005-110017 | 4/2005 |
| JP | 2005-311511 | 11/2005 |
| JP | 2007-104458 | 4/2007 |
| JP | 2007-181185 | 7/2007 |
| WO | WO 2006/018788 * | 2/2006 |

OTHER PUBLICATIONS

Piazza, G. et al., "Single-Chip Multiple-Frequency ALN MEMS Filters Based on Contour-Mode Piezoelectric Resonators," Journal of Microelectromechanical Systems, vol. 16, No . 2 , Apr. 2007, pp. 319-328.

Piazza, G. et al., "Piezoelectric Aluminum Nitride Vibrating Contour-Mode MEMS Resonators," Journal of Microelectromechanical Systems, vol. 15, No. 6, Dec. 2006, pp. 1206-1418.

Clark, J.R. et al., "High-Q UHF Micromechanical Radial-Contour Mode Disk Resonators," Journal of Microelectromechanical Systems, vol. 14, No. 6, Dec. 2005, pp. 1298-1310.

El-Shafie, M. K. et al., "Behavioral Modeling of RF-MEMS Disk Resonator," The 2006 International Conference on MEMS, NANO and Smart Systems, pp. 23-26, 2006.

Piazza, G. et al., "Aluminum Nitride Contour-Mode Vibrating RF MEMS," Microwave Symposium Digest, IEEE MTT-S International, pp. 664-667, 2006.

Stephanou, P. J. et al., "Mechanically Coupled Contour Mode Piezoelectric Aluminum Nitride MEMS Filters," IEEE, MEMS 2006 Istanbul, pp. 906-909, 2006.

Piazza, G. et al., "A1N Contour-Mode Vibrating RF MEMS for Next Generation Wireless Communications," Solid-State Device Research Conference, ESSDERC 2006, IEEE, pp. 61-64, 2006.

Piazza, G. et al., "Low Motional Resistance Ring-Shaped Contour-Mode Aluminum Nitride Piezoelectric Micromechanical Resonators for UHF Applications," Micro Electro Mechanical Systems, MEMS 2005, IEEE, pp. 20-23, 2005.

Maxey, C. et al., "Finite Element-Based Analysis of Single-Crystal Si Contour-Mode Electromechanical RF Resonators," Proceeding of the 2004 ICMENS, 2004, 5 pages.

Abdelmoneum, M. A. et al., "Stemless Wine-Glass-Mode Disk Micromechanical Resonators," Micro Electro Mechanical Systems, MEMS-03 Kyoto, IEEE, pp. 698-701, 2003.

Piazza, G. et al., "A1N Contour-Mode Vibrating RF MEMS for Next Generation Wireless Communications," Solid-State Circuits Conference, ESSCIRC 2006, IEEE, pp. 62-65, 2006.

Wang, J. et al., "1.14-GHz Self-Aligned Vibrating Micromechanical Disk Resonator," 2003 IEEE Radio Frequency Integrated Circuits Symposium, pp. 335-338, 2003.

Hsu, Wan-Thai et al., "A Sub-Micron Capacitive Gap Process for Multiple-Metal-Electrode Lateral Micromechanical Resonators," Micro Electro Mechanical Systems, MEMS 2001, IEEE, pp. 349-352, 2001.

Stephanou, P. J., et al., "GHZ Contour Extensional Mode Aluminum Nitride MEMS Resonators," 2006 IEEE Ultrasonics Symposium, pp. 2401-2404, 2006.

Muller C et al: "A high performance WCDMA hybrid differential BAW filter," 2005 IEEE Ultrasonics Symposium, vol. 1, pp. 81-84, Sep. 2005.

European Search Report dated Jun. 24, 2009, for corresponding EP Application No. 09003770.6.

* cited by examiner

FIG.8
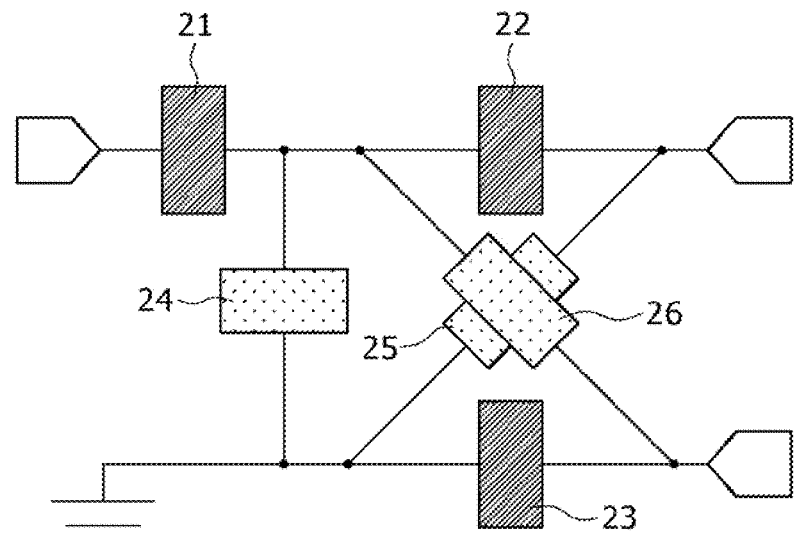
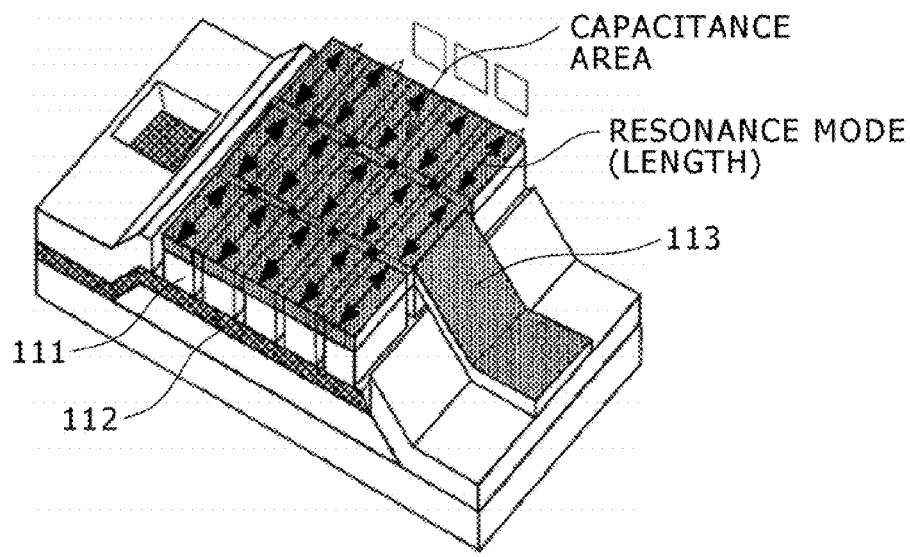
CAPACITANCE AREA
RESONANCE MODE (LENGTH)
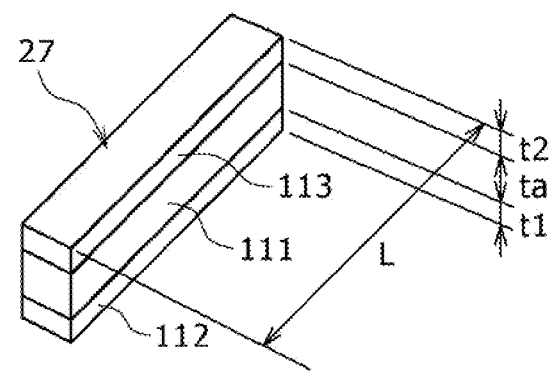

FIG.12
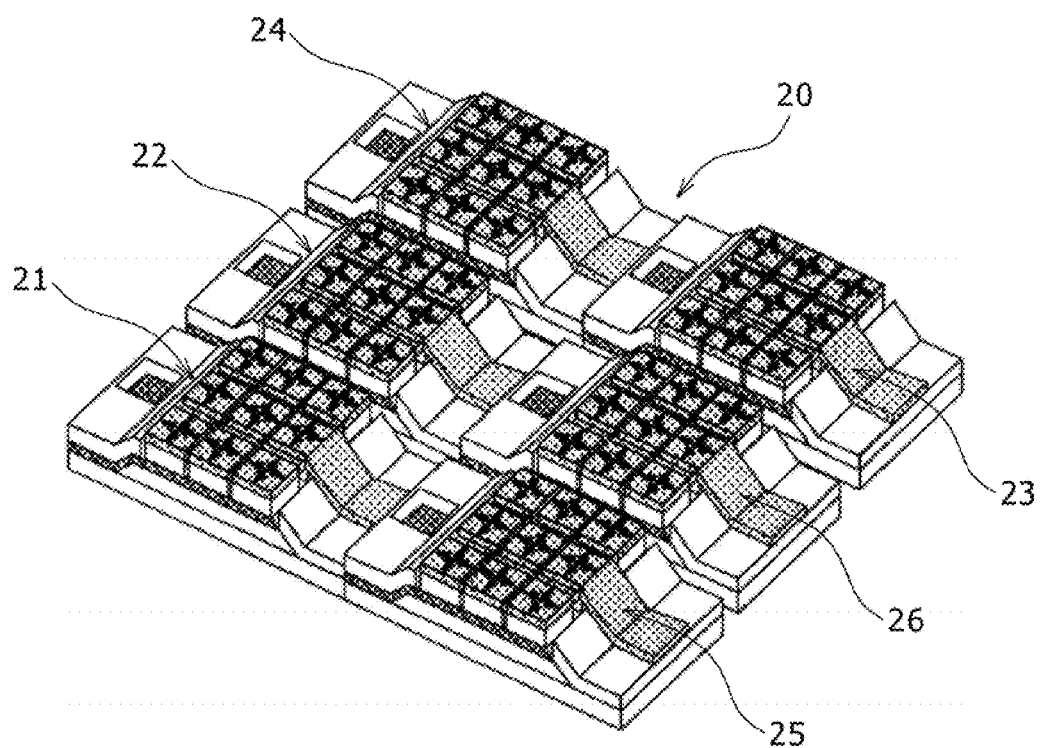
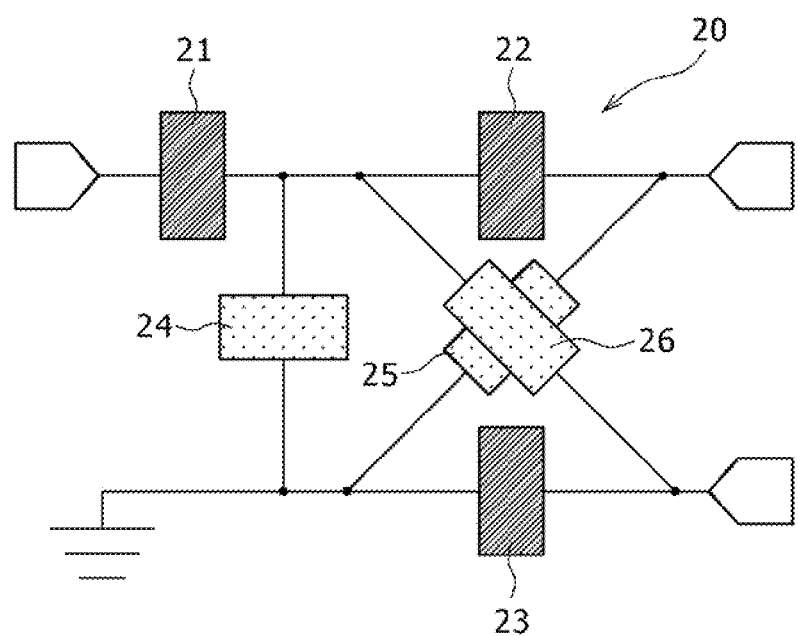

FIG.13
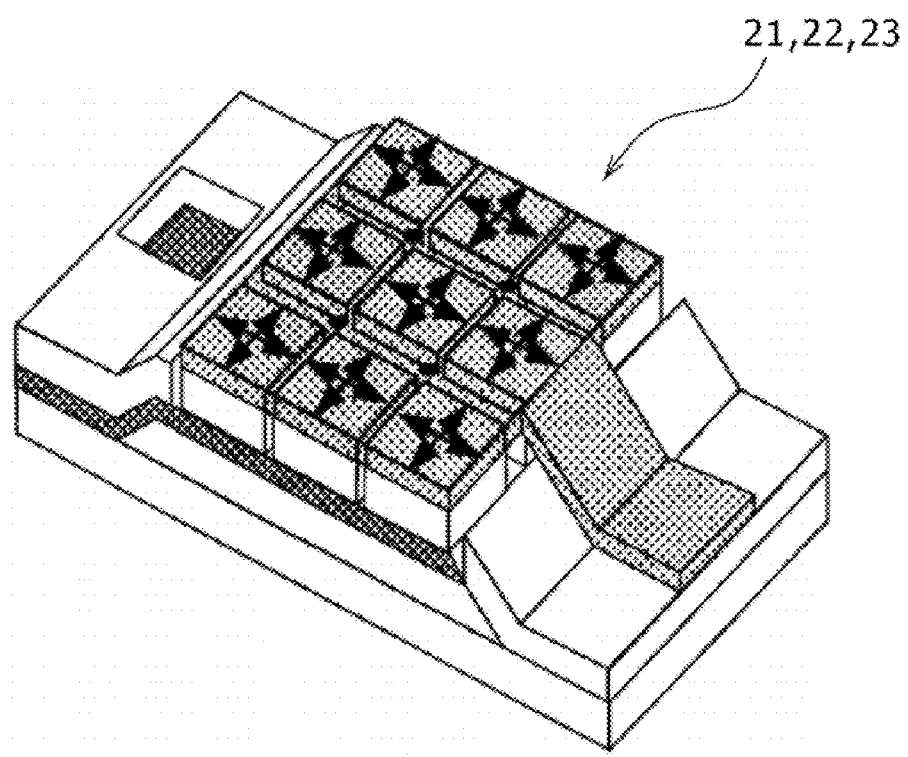
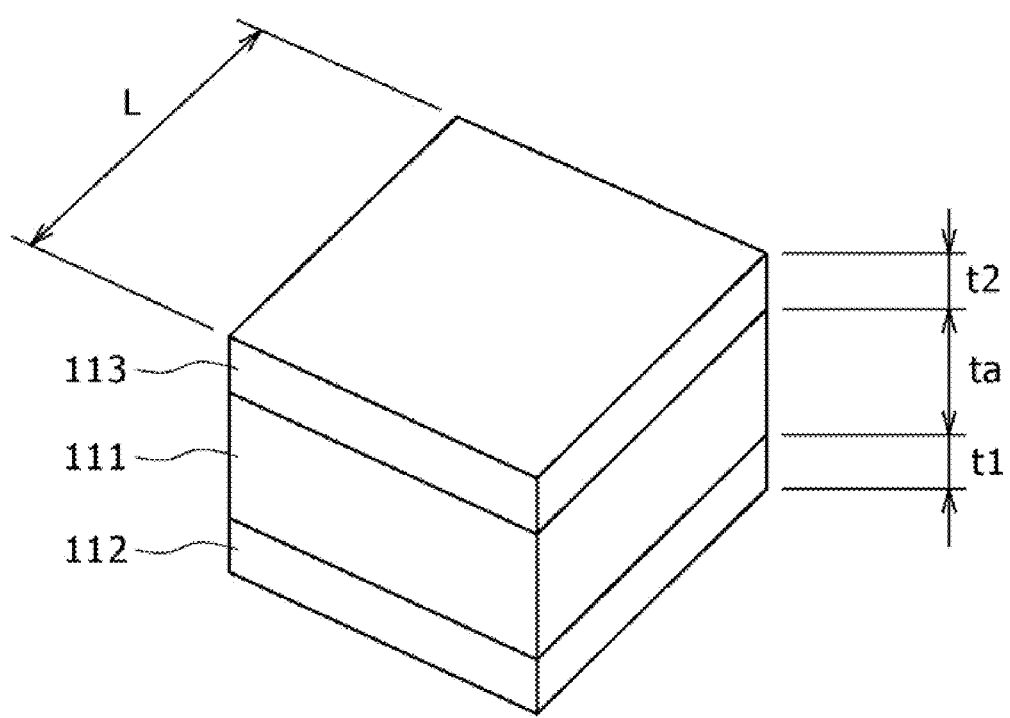

FIG. 14
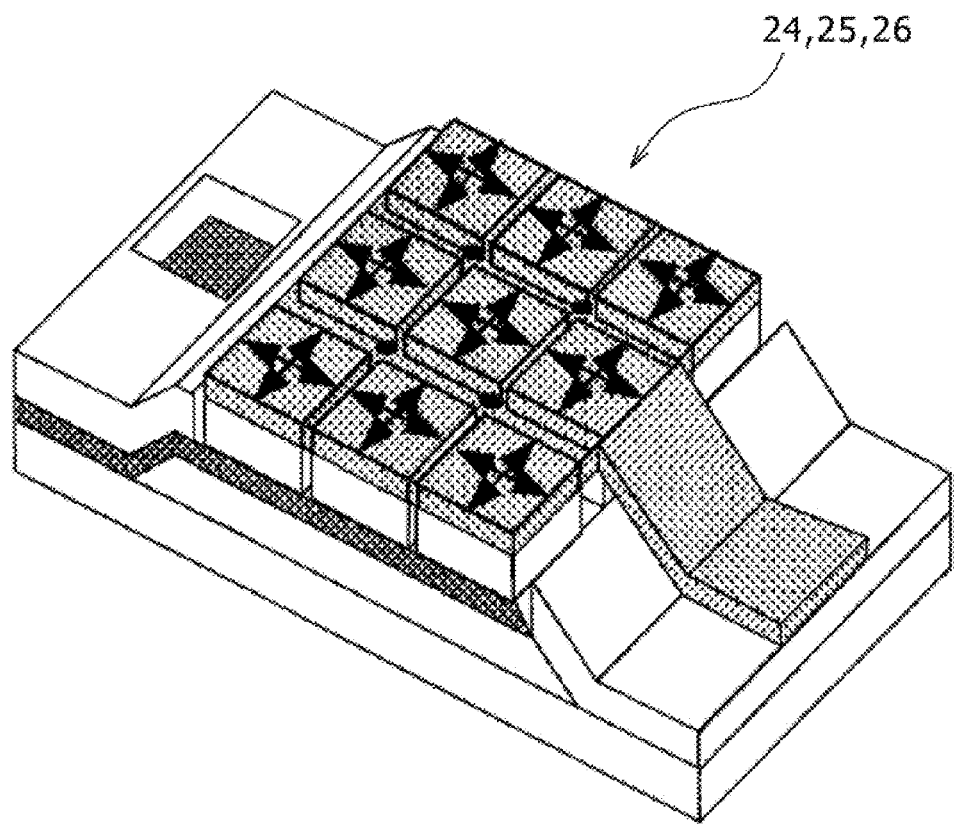
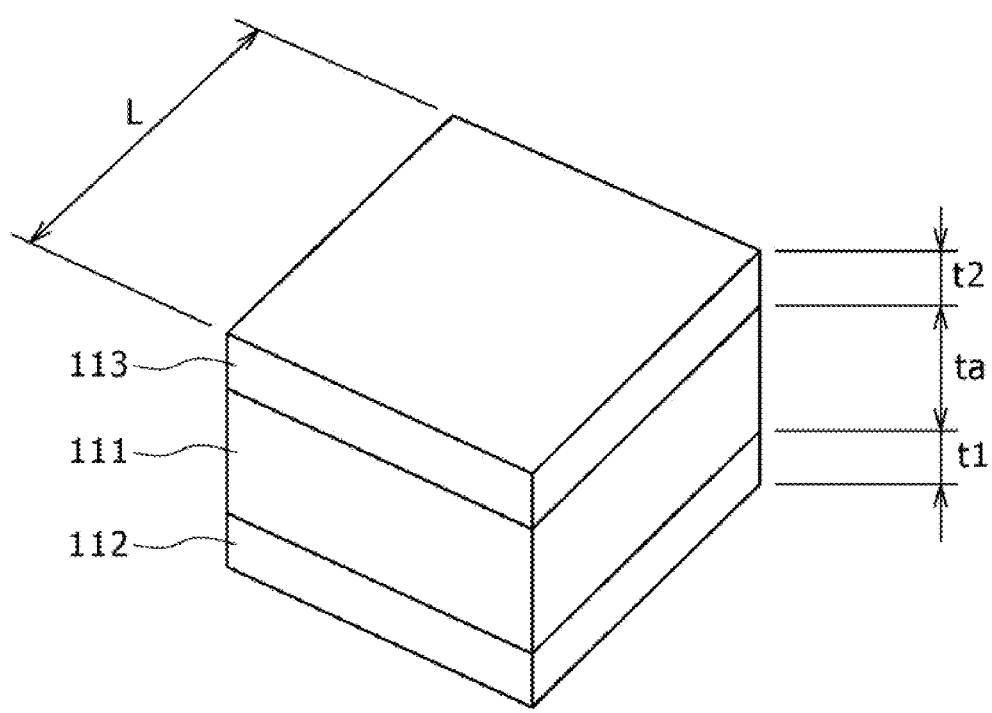

RESONATOR ELEMENT CHARACTERISTICS

| fr | 1.696E+08 |
|---|---|
| NormalZfr | 0.144 |
| fa | 1.727E+08 |
| NormalZfa | 5.611 |
| Rm | 12.689 |
| Cm | 3.056E-13 |
| Lm | 2.882E-06 |
| Cp | 8.392E-12 |
| Keff2c^2 | 3.64% |
| Qs | 190.7 |
| Qp | 187.4 |

RESONATOR ELEMENT CHARACTERISTICS

| fr | 1.755E+08 |
|---|---|
| NormalZfr | 0.268 |
| fa | 1.788E+08 |
| NormalZfa | 3.643 |
| Rm | 2.367 |
| Cm | 1.563E-12 |
| Lm | 5.259E-07 |
| Cp | 4.196E-11 |
| Keff2c^2 | 3.73% |
| Qs | 100.3 |
| Qp | 98.5 |

FIG.19
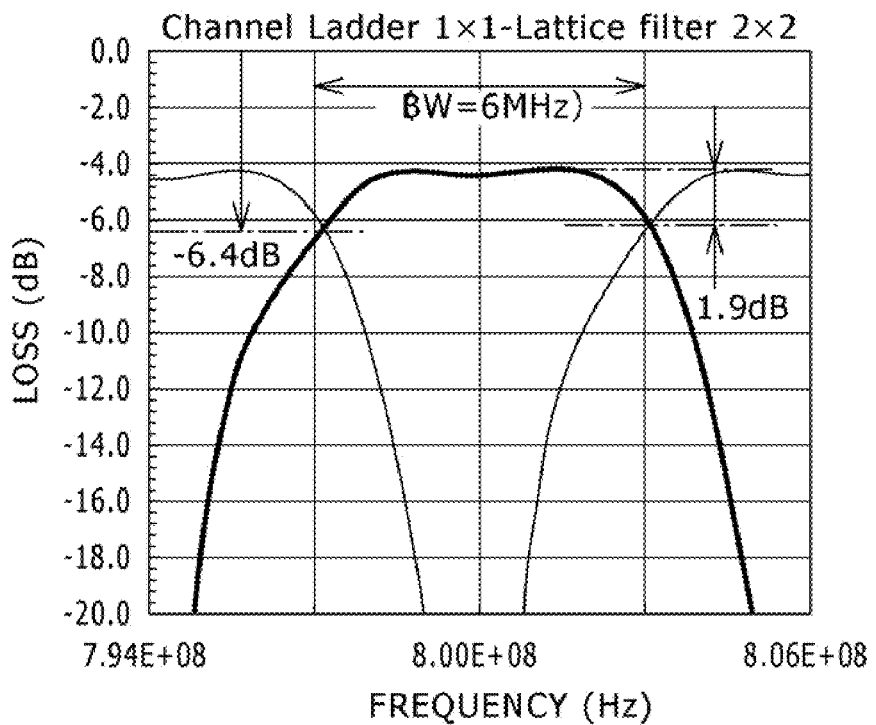
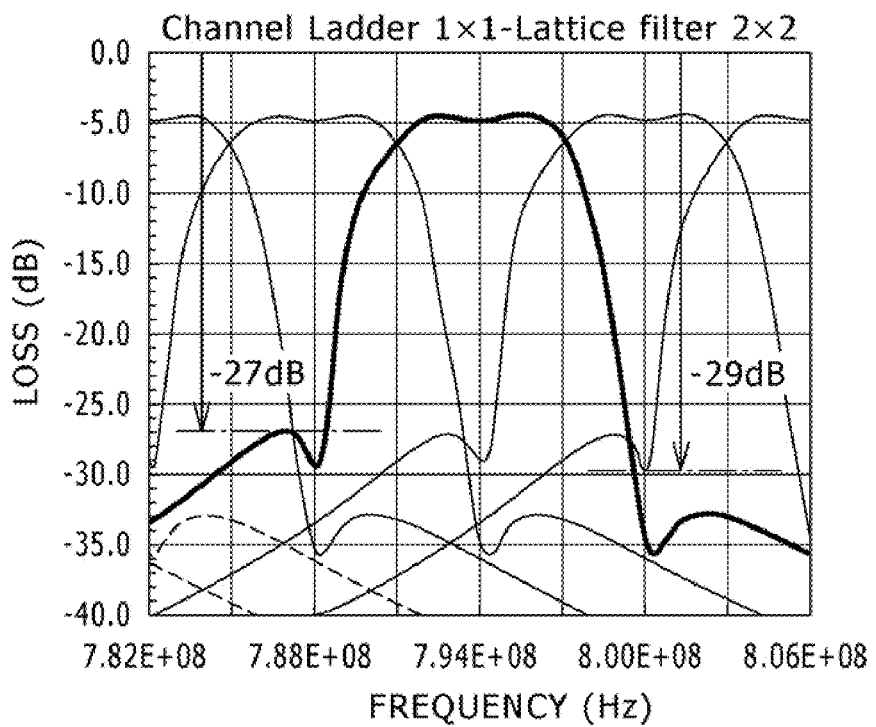

FIG.21
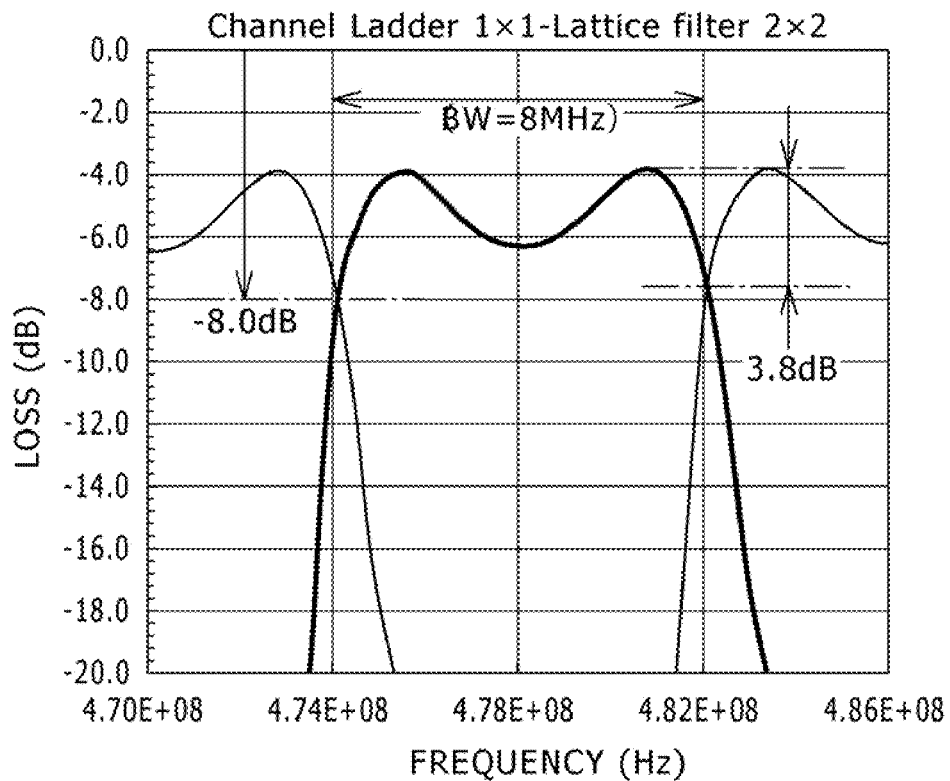
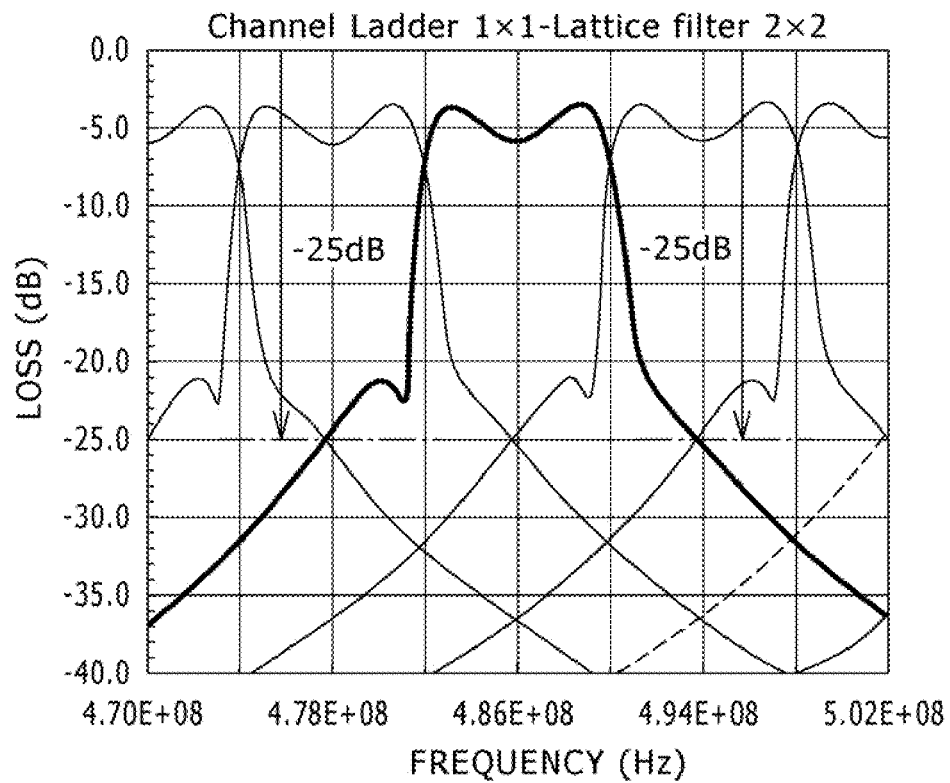

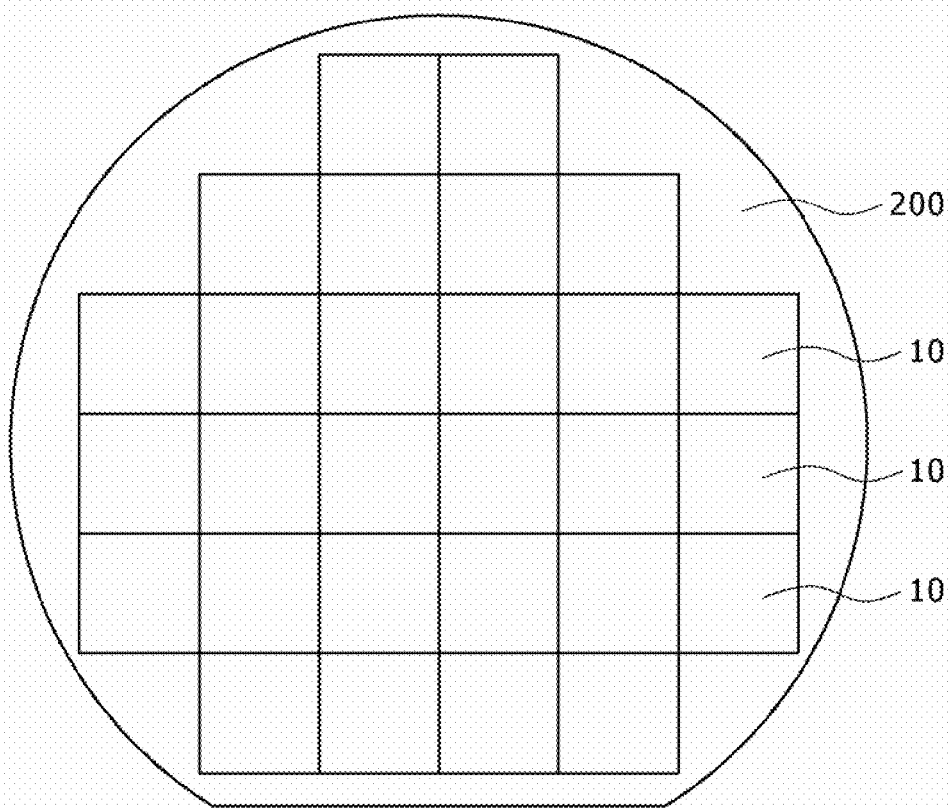

FIG.26

EXAMPLE OF RESONANCE MODE OF PIEZOELECTRIC RESONATOR AND ELECTROMECHANICAL COUPLING FACTOR

| RESONANCE MODE AND ELECTROMECHANICAL COUPLING FACTOR | | $k_{31}$ LONG SIDE DIRECTION ELONGATION VIBRATION t=1.0 ℓ=12 a=3 | $k_p$ RADIAL DIRECTION VIBRATION t=1.0 φd=15 | $k_{33}$ LONGITUDINAL VIBRATION ℓ=15 φd=6 | $k_t$ THICKNESS LONGITUDINAL VIBRATION t=1.0 φd=18 | $k_{15}$ THICKNESS SHEAR VIBRATION t=0.25 ℓ=10.0 a=2.5 |
|---|---|---|---|---|---|---|
| | CONDITIONS | ℓ/a≧4 a/t≧3 ℓ≧12 | d/t≧15 | ℓ/d>2.5 | d/t≧10 | ℓ>a>t ℓ/t>32 |
| (EXAMPLE) AlN NOMINAL VALUES | k | 0.15 | 0.23 | 0.31 | 0.23 | 0.14 |
| | $k^2$(%) | 2.25% | 5.29% | 9.61% | 5.29% | 1.96% |

BAND-PASS FILTER DEVICE, METHOD OF MANUFACTURING SAME, TELEVISION TUNER, AND TELEVISION RECEIVER

CROSS REFERENCES TO RELATED APPLICATIONS

The present application claims priority to Japanese Patent Application JP 2008-068965 filed in the Japan Patent Office on Mar. 18, 2008, the entire contents of which is being incorporated herein by reference.

BACKGROUND

The present application relates to a band-pass filter device, a method of manufacturing the same, a television tuner, and a television receiver.

Description will be made of a current system of a television (hereinafter described as TV) channel tuner.

A frequency selecting filter system realized by varying a coil (L) and a capacitor (C) as external parts is now used most widely as a method for selecting a desired channel from a wide frequency range (fractional bandwidth (%) varies greatly in a wide range of a frequency band in a case of a uniform bandwidth in particular) as in a tuner of a high-quality terrestrial television receiver.

A frequency selecting filter of a tuner of a TV receiver or a radio receiver is thus formed by a resonant circuit having a coil and a capacitor connected to each other.

The resonant circuit is formed by connecting the coil (L) and the capacitor (C) in parallel with each other, and the resonance frequency of the resonant circuit is given by an equation $f=1/(2\pi\sqrt{LC})$, where the unit of L is H (henry), and the unit of C is F (farad).

A TV receiver in particular selects a channel in wide frequency ranges of a VHF band and a UHF band. Thus, an optimum coil (inductance) needs to be selected for each frequency range, and a large number of external coils are often used. This is because when a resonant circuit is formed using a same coil for all of the wide frequency ranges, the pass band width of the channel filter varies greatly in each frequency range.

Present techniques for forming an on-chip filter on a wafer will next be described in the following.

There are techniques that do not use external parts such as a coil or a capacitor as described above or the like at all and which are regarded as promising for achieving excellent characteristics. The techniques include a band-pass filter using a "micro electromechanical system (MEMS) resonator element" or a "thin-film piezoelectric resonator element" that can be manufactured on a wafer by a semiconductor manufacturing process. Progress has been made in development of a system in which all channels are arranged on a chip using these resonator elements formed on the chip and selected by a switch in place of the tunable system of a current tuner.

For example, the concept of a piezoelectric resonator element device in which a plurality of piezoelectric resonator element groups forming a filter and having different frequencies are laminated so that desired resonator element groups are formed integrally has already been disclosed (see Japanese Patent Laid-Open No. Sho 55-50720, for example).

However, this technique laminates a plurality of resonator elements, and thus does not form a plurality of resonator elements en bloc on a wafer. Thus, the number of processes is increased, and the processes become complex, which raises a fear of an increase in manufacturing cost. The technique is therefore impractical.

Another technique for realizing a variable filter by applying a series voltage to a resonator element forming a filter and thus changing resonance frequency has been disclosed (see Japanese Patent Laid-Open No. 2003-168955, for example).

However, a range of variation of the resonance frequency is very limited (about a few %), and thus the technique cannot handle an entire frequency range of actual TV channels (from a VHF band (174 to 240 MHz) to a UHF band (470 to 862 MHz)).

Meanwhile, many examples of a resonator element and a filter formed onto a wafer have been disclosed (see Non-Patent Documents 1 to 16 listed below).

[Non-Patent Document 1]
"Single-Chip Multiple-Frequency ALN MEMS Filters Based on Contour-Mode Piezoelectric Resonators" 2007/4/ Microelectromechanical Systems, Journal of Volume 16, Issue 2, pp. 319-328, April 2007

[Non-Patent Document 2]
"Piezoelectric Aluminum Nitride Vibrating Contour-Mode MEMS Resonators" 2006/12/Microelectromechanical Systems, Journal of Volume 15, Issue 6, pp. 1406-1418, December 2006

[Non-Patent Document 3]
"Aluminum Nitride Contour-Mode Vibrating RF MEMS" 2006/6/Microwave Symposium Digest, 2006. IEEE MTT-S International, pp. 664-667, June 2006

[Non-Patent Document 4]
"Behavioral Modeling of RF-MEMS Disk Resonator" 2006/12/MEMS, NANO and Smart Systems, The 2006 International Conference on Dec. 2006, pp. 23-26, December 2006

[Non-Patent Document 5]
"Mechanically Coupled Contour Mode Piezoelectric Aluminum Nitride MEMS Filters" 2006/1/Micro Electro Mechanical Systems, 2006. MEMS 2006 Istanbul. 19th IEEE International Conference on 2006, pp. 906-909, 2006

[Non-Patent Document 6]
"One and Two Port Piezoelectric Contour-Mode MEMS Resonators for Frequency Synthesis" 2006/9/Solid-State Device Research Conference, 2006. ESSDERC 2006. Proceeding of the 36th European, pp. 182-185, September 2006

[Non-Patent Document 7]
"AlN Contour-Mode Vibrating RF MEMS for Next Generation Wireless Communications" 2006/9/Solid-State Circuits Conference, 2006. ESSCIRC 2006. Proceedings of the 32nd European, pp. 62-65, September 2006

[Non-Patent Document 8]
"PS-4 GHZ Contour Extensional Mode Aluminum Nitride MEMS Resonators" 2006/10/Ultrasonics Symposium, 2006. IEEE, pp. 2401-2404, October 2006

[Non-Patent Document 9]
"AlN Contour-Mode Vibrating RF MEMS for Next Generation Wireless Communications" 2006/9/Solid-State. Device Research Conference, 2006. ESSDERC 2006. Proceeding of the 36th European, pp. 61-64, September 2006

[Non-Patent Document 10]
"High-Q UHF micromechanical radial-contour mode disk resonators" 2005/12/Microelectromechanical Systems, Journal of Volume 14, Issue 6, Dec. 2005, pp. 1298-1310, December 2005

[Non-Patent Document 11]
"Low motional resistance ring-shaped contour-mode aluminum nitride piezoelectric micromechanical resonators for UHF applications" 2005/1 Micro Electro Mechanical Systems, 2005. MEMS 2005. 18th IEEE International Conference on 30 Jan.-3 Feb. 2005, pp. 20-23, 2005

[Non-Patent Document 12]
"Finite Element-Based Analysis of Single-Crystal Si Contour-Mode Electromechanical RF Resonators" 2004/8/MEMS, NANO and Smart Systems, 2004. ICMEMS 2004. Proceedings. 2004 International Conference on 25-27 Aug. 2004, pp. 461-465, 2004

[Non-Patent Document 13]
"Finite element-based analysis of single-crystal Si contour-mode electromechanical RF resonators" 2004/8/MEMS, NANO and Smart Systems, 2004. ICMEMS 2004. Proceedings. 2004 International Conference on 25-27, pp. 414-418, August 2004

[Non-Patent Document 14]
"Stemless wine-glass-mode disk micromechanical resonators" 2003/1/Micro Electro Mechanical Systems, 2003. MEMS-03 Kyoto. IEEE The Sixteenth Annual International Conference on 19-23 Jan. 2003, pp. 698-701, January 2003

[Non-Patent Document 15]
"1.14-GHz self-aligned vibrating micromechanical disk resonator" 2003/6/Radio Frequency Integrated Circuits (RFIC) Symposium, 2003 IEEE, pp. 335-338, June 2003

[Non-Patent Document 16]
"A sub-micron capacitive gap process for multiple-metal-electrode lateral micromechanical resonators" 2001/1/Micro Electro Mechanical Systems, 2001. MEMS 2001. The 14th IEEE International Conference on 21-25 Jan. 2001, pp. 349-352, January 2001

A current technological level will next be described in the following.

As for problems of a filter system using external parts (for example, an external coil), a filter characteristic that selects only a desired channel is desired from a need of reception performance.

However, there is a limitation to characteristics of theoretical frequency selectivity of a filter formed by a resonant circuit in which a coil and a capacitor are connected to each other, and high-image-quality reception is restricted by an effect of noise signals of adjacent channels.

On the other hand, as described above, the filter system using the resonant circuit of the coil and the capacitor causes the following problems when the value of the coil is not optimized for each frequency region. For example, because the pass band width of the channel filter varies greatly, a large number of coil parts are used, which is a great impediment to reduction of manufacturing cost.

In addition, the techniques of forming an on-chip filter on a current wafer have not achieved a level of filter characteristics for realizing a television channel filter having excellent selectivity.

In order to realize an excellent television channel filter as a wafer on-chip filter economically reasonably, a large number of resonator elements of different frequencies need to be simultaneously formed en bloc. For 60 channels, for example, at least 120 kinds of resonator elements of different frequencies are necessary.

Thus, it is clear that the adoption of a resonance mode in a lateral direction (a system of designing resonance frequency by dimensions of a mask, and typically area vibration/shear vibration/elongation vibration) is very useful (see FIG. 26).

However, at present, in the lateral resonance mode, a resonator element in the most advanced stage of development has not achieved a lateral electromechanical coupling factor ($k^2$) of 1% or more.

It is considered that the electromechanical coupling factor ($k^2$) of a MEMS resonator element not using a piezoelectric material has a limit of about 0.5%.

Moreover, filters in these lateral direction resonance modes have not achieved even a fractional bandwidth of 1.70% (see Non-Patent Documents 1 to 16, for example).

Technical problems that cannot be overcome by the related techniques alone will be described in the following.

The following problems are present before a filter for TV channels is realized by a band-pass filter formed by piezoelectric resonator elements on a wafer by a semiconductor manufacturing process.

No provision has been made for a wide frequency range (from the VHF band to the UHF band). In addition, in a band-pass filter capable of channel selection with a fixed bandwidth, a practical method such as simultaneously forming resonator elements intended for the whole of a wide range of fractional bandwidth, which changes with variation in the frequency region, en bloc on a single chip on a wafer has not been proposed nor realized.

For example, there is a desire fo a band-pass filter capable of channel selection with bandwidth fixed at 6 MHz, 7 MHz, and 8 MHz, for example, as fixed bandwidth, as shown in Table 1.

In this band-pass filter, the fractional bandwidth (%) which changes with variation in the frequency region is 11.1% to 0.74% in terrestrial digital broadcasting all over the world, for example. In order to achieve the whole of such a wide range of the fractional bandwidth, the electromechanical coupling factor of resonator elements needs to be 9.09% to 0.60%.

However, a practical method such as simultaneously forming such resonator elements en bloc on a single chip on a wafer has not been realized. It is possible, however, to achieve only specific fractional bandwidths.

TABLE 1

FRACTIONAL BAND WIDTHS (%) OF TV CHANNELS AND ELECTROMECHANICAL COUPLING FACTORS REQUIRED OF CORRESPONDING RESONATOR ELEMENTS

| | | VHF (L-BAND) 5ch | | | | VHF (H-BAND) 11ch | | | UHF 49ch to 56ch | | |
|---|---|---|---|---|---|---|---|---|---|---|---|
| | | 54 MHz | 72 MHz | 76 MHz | 88 MHz | 174 MHz | 216 MHz | 244 MHz | 470 MHz | 806 MHz | 862 MHz |
| FRACTIONAL BAND WIDTH (%) OF TV CHANNEL BAND | | | | | | | | | | | |
| JAPAN | 6 MHz | | | | | | | | 1.28% | 0.74% | |
| NORTH AMERICA | 6 MHz | 11.11% | 8.33% | 7.89% | 6.82% | 3.45% | 2.78% | | 1.28% | 0.74% | |
| EUROPE | 7 MHz | | | | | 4.02% | | 2.87% | | | |
| | 8 MHz | | | | | | | | | 1.70% | 0.93% |

TABLE 1-continued

FRACTIONAL BAND WIDTHS (%) OF TV CHANNELS AND ELECTROMECHANICAL COUPLING FACTORS
REQUIRED OF CORRESPONDING RESONATOR ELEMENTS

| | | VHF (L-BAND) 5ch | | | | VHF (H-BAND) 11ch | | | UHF 49ch to 56ch | | |
|---|---|---|---|---|---|---|---|---|---|---|---|
| | | 54 MHz | 72 MHz | 76 MHz | 88 MHz | 174 MHz | 216 MHz | 244 MHz | 470 MHz | 806 MHz | 862 MHz |
| ELECTRO-MECHANICAL COUPLING FACTOR (%) REQUIRED OF RESONATOR ELEMENT | | | | | | | | | | | |
| JAPAN | 6 MHz | | | | | | | | 1.02% | 0.60% | |
| NORTH AMERICA | 6 MHz | 9.09% | 6.78% | 6.42% | 5.53% | 2.78% | 2.23% | | 1.02% | 0.60% | |
| EUROPE | 7 MHz | | | | | 3.24% | | 2.31% | | | |
| | 8 MHz | | | | | | | | 1.37% | | 0.74% |

In each frequency region of the UHF band, a VHF high-frequency band (hereinafter referred to as VHF-H), and a VHF low-frequency band (hereinafter referred to as VHF-L), resonance modes for different electromechanical coupling factors are selected, and filter design is made. Design has not been made which then realizes a filter in which consecutive frequency channels are sequentially arranged along frequency within each of the frequency regions (UHF, VHF-H, and VHF-L) and which filter handles the consecutive variations in fractional bandwidth.

Generally, in a filter constitution based on electric coupling of a resonator element formed on many wafers thus far, one resonator element forming a filter is formed entirely by one vibrator. This is because the design of the vibrator coincides with the design of the resonator element, and thus filter design can be greatly simplified and made easily. On the other hand, however, there is a very difficult problem in impedance matching (50Ω to 150Ω), which consequently invites a great loss of a pass region of the filter.

When television channels and the like are realized by a band-pass filter by arranging all channels on a wafer chip, a yield tends to be decreased due to variations in precision of resonator elements in manufacturing processes. In addition, in order to make provision for digital television broadcasting all over the world, resonator elements need to be made differently according to specifications of different countries. Therefore, manufacturing cost is increased, and manufacturing becomes complex.

In addition, as in ordinary MEMS (Micro Electro Mechanical Systems) devices, the hollow structure has invited an increase in cost of forming a package.

SUMMARY

A problem to be addressed is a difficulty in forming band-pass filters capable of handling such a wide frequency band as to span both the UHF band and the VHF band on a same substrate.

The present application makes it possible to form band-pass filters capable of handling such a wide frequency band as to span both the UHF band and the VHF band on a same substrate.

According to an embodiment, there is provided a band-pass filter device including: a plurality of band-pass filter elements on a principal plane of a substrate; wherein the band-pass filter elements correspond to a plurality of respective channels divided by frequency regions, and each have a plurality of piezoelectric resonators. Each of the piezoelectric resonators includes: a piezoelectric film whose periphery is supported by the substrate; a first electrode formed on a lower surface of the piezoelectric film; and a second electrode formed on an upper surface of the piezoelectric film and formed in a state of overlapping at least a part of the first electrode with the piezoelectric film interposed between the second electrode and the first electrode. Each of the piezoelectric resonators further includes: a lower space formed between the substrate and the piezoelectric film; and an upper space formed over the piezoelectric film.

In the band-pass filter device according to the above-described embodiment, each of the band-pass filter elements adopts the above-described piezoelectric film structure. Specifically, length in a one-dimensional direction (length resonance mode) or length in two-dimensional directions (area resonance mode) of the piezoelectric film interposed between the first electrode and the second electrode is changed, whereby the piezoelectric resonators forming the band-pass filter elements for passing a desired frequency band are formed. In addition, the band-pass filter elements correspond to the plurality of respective channels divided by frequency regions. Thus, a plurality of band-pass filter elements adjusted to frequency bands of television, for example, both the UHF band and the VHF band can be provided on a same substrate.

According to an embodiment, there is provided a method of manufacturing a band-pass filter device, the method including the steps of: forming a band-pass filter element by forming a plurality of piezoelectric resonators on a principal plane of a substrate, and forming a plurality of such band-pass filter elements. The step of forming each of the piezoelectric resonators includes the steps of: forming a first sacrifice layer on the substrate; forming a first electrode so as to cover a part of the first sacrifice layer; forming a piezoelectric film to cover the first electrode and the first sacrifice layer; and forming a second electrode so as to cover a part of the piezoelectric film, the second electrode having a part overlapping the first electrode with the piezoelectric film interposed between the second electrode and the first electrode. In addition, the method includes a step of forming a first through hole to communicate with the first sacrifice layer formed between the substrate and the piezoelectric film after forming the piezoelectric film or after forming the second electrode. The method further includes the steps of: forming a second sacrifice layer to cover the second electrode on the piezoelectric film after forming the first through hole; and forming an upper space forming film to cover the second sacrifice layer. The method further includes the steps of: forming a second through hole to communicate with the second sacrifice layer formed between the piezoelectric film and the upper space forming film after forming the upper space forming film; and removing the first sacrifice layer through the first through hole, and removing the second sacrifice layer through the second through hole.

The method of manufacturing the band-pass filter device according to a foregoing embodiment forms the above-described piezoelectric film structure in each band-pass filter element, whereby length in a one-dimensional direction (length resonance mode) or length in two-dimensional directions (area resonance mode) of the piezoelectric film interposed between the first electrode and the second electrode can be changed. Thus, piezoelectric resonators forming the band-pass filter elements for passing a desired frequency band are formed. In addition, the band-pass filter elements can correspond to a plurality of respective channels divided by frequency regions. Thus, a plurality of band-pass filter elements adjusted to frequency bands of television, for example, both the UHF band and the VHF band can be provided on a same substrate.

According to an embodiment, there is provided a television tuner including: a plurality of switches for selecting a television signal received by an antenna; and a band-pass filter device disposed so as to correspond to each of the switches. The band-pass filter device includes: a plurality of band-pass filter elements on a principal plane of a substrate; wherein the band-pass filter elements correspond to a plurality of respective channels divided by frequency regions, and each have a plurality of piezoelectric resonators. Each of the piezoelectric resonators includes: a piezoelectric film whose periphery is supported by the substrate; a first electrode formed on a lower surface of the piezoelectric film; and a second electrode formed on an upper surface of the piezoelectric film and formed in a state of overlapping at least a part of the first electrode with the piezoelectric film interposed between the second electrode and the first electrode. Each of the piezoelectric resonators further includes: a lower space formed between the substrate and the piezoelectric film; and an upper space formed over the piezoelectric film.

The television tuner according to the above-described embodiment has the band-pass filter device according to the above-described embodiment. Thus, as compared with an external band-pass filter device formed by a LC circuit in related art, the band-pass filter device for a wide frequency band is formed on one substrate.

According to an embodiment, there is provided a television receiver including: a television tuner including a plurality of switches for selecting a television signal received by an antenna and a band-pass filter device disposed so as to correspond to each of the switches. The band-pass filter device includes: a plurality of band-pass filter elements on a principal plane of a substrate; wherein the band-pass filter elements correspond to a plurality of respective channels divided by frequency regions, and each have a plurality of piezoelectric resonators. Each of the piezoelectric resonators includes: a piezoelectric film whose periphery is supported by the substrate; a first electrode formed on a lower surface of the piezoelectric film; and a second electrode formed on an upper surface of the piezoelectric film and formed in a state of overlapping at least a part of the first electrode with the piezoelectric film interposed between the second electrode and the first electrode. Each of the piezoelectric resonators further includes: a lower space formed between the substrate and the piezoelectric film; and an upper space formed over the piezoelectric film.

The television receiver according to the above-described embodiment has the television tuner according to the above-described embodiment. Thus, as compared with a television tuner having an external band-pass filter device formed by a LC circuit in related art, the band-pass filter device for a wide frequency band is formed on one substrate.

The band-pass filter device according to the above-described embodiment can deal with a wide frequency band and a wide range of fractional bandwidth (%) on a so-called one chip. For example, the band-pass filter device can deal with a wide frequency band from the VHF band to the UHF band. It is therefore possible to achieve excellent filter characteristics that can attenuate element frequency regions including adjacent channels outside the pass band of one channel very sharply as compared with filter characteristics of a related resonant circuit of a coil and a capacitor. Thus, there is an advantage of being able to reduce the noise of a received channel greatly and perform high-quality reception.

The method of manufacturing the band-pass filter device according to the above-described embodiment can form the band-pass filter device capable of dealing with a wide frequency band and a wide range of fractional bandwidth (%) on a so-called one chip. For example, the band-pass filter device can deal with a wide frequency band from the VHF band to the UHF band. It is therefore possible to achieve excellent filter characteristics that can attenuate element frequency regions including adjacent channels outside the pass band of one channel very sharply as compared with filter characteristics of a related resonant circuit of a coil and a capacitor. Thus, there is an advantage of being able to reduce the noise of a received channel greatly and perform high-quality reception.

The television tuner according to the above-described embodiment uses the band-pass filter device according to the above-described embodiment. Thus, the television tuner can achieve excellent filter characteristics capable of sharp attenuation in a very wide frequency range. The television tuner has another advantage of being able to greatly reduce the noise of a received channel, and perform high-quality reception.

The television receiver according to the above-described embodiment uses the television tuner according to the above-described embodiment. Thus, the television receiver can achieve excellent filter characteristics capable of sharp attenuation in a very wide frequency range. The television receiver has another advantage of being able to greatly reduce the noise of a received channel, and perform high-quality reception.

Additional features and advantages are described herein, and will be apparent from the following Detailed Description and the figures.

BRIEF DESCRIPTION OF THE FIGURES

FIG. 8 is a circuit diagram and a schematic perspective view of assistance in explaining a band-pass filter element;

FIG. 12 is a circuit diagram and a schematic perspective view of assistance in explaining a band-pass filter element;

FIG. 13 is a schematic perspective view of a piezoelectric resonator and resonator elements;

FIG. 14 is a schematic perspective view of a piezoelectric resonator and resonator elements;

FIG. 19 is a diagram of frequency characteristics;

FIG. 21 is a diagram of frequency characteristics;

FIG. 24 is a plan view of band-pass filter devices formed on a wafer;

FIG. 26 is a diagram showing an example of resonance modes and electromechanical coupling factors of piezoelectric resonators.

DETAILED DESCRIPTION

An embodiment of a band-pass filter device according to the present application will be described with reference to a schematic plan layout view of FIG. 1.

Figure 1:
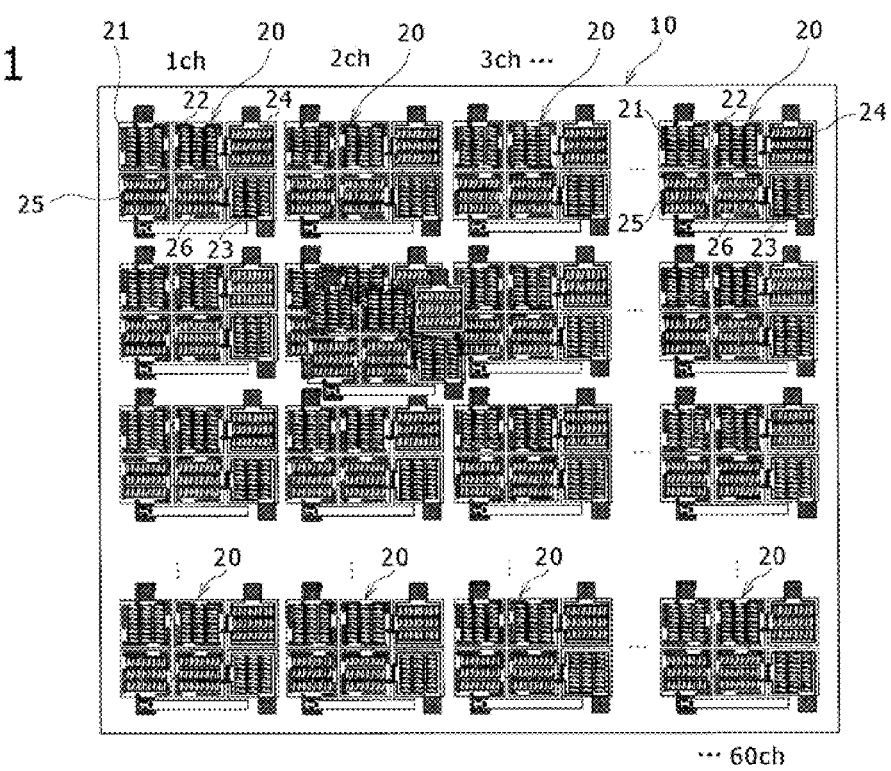
FIG. 1 is a schematic plan layout view of an embodiment of a band-pass filter device.

As shown in FIG. 1, a band-pass filter device 10 has a plurality of band-pass filter elements 20 on a principal plane of a substrate 11. The band-pass filter elements 20 correspond to a plurality of respective channels divided by frequency regions. Each of the band-pass filter elements 20 is, for example, composed of a plurality of piezoelectric resonators 21 to 26. In an example shown in the drawing, band-pass filter elements 20 are provided for 60 channels, for example. The drawing shows a part of the band-pass filter elements 20.

The constitution of the band-pass filter element 20 will next be described with reference to a circuit diagram of FIG. 2, a schematic perspective view of FIG. 3, and a schematic sectional view of FIG. 4.

Figure 2:
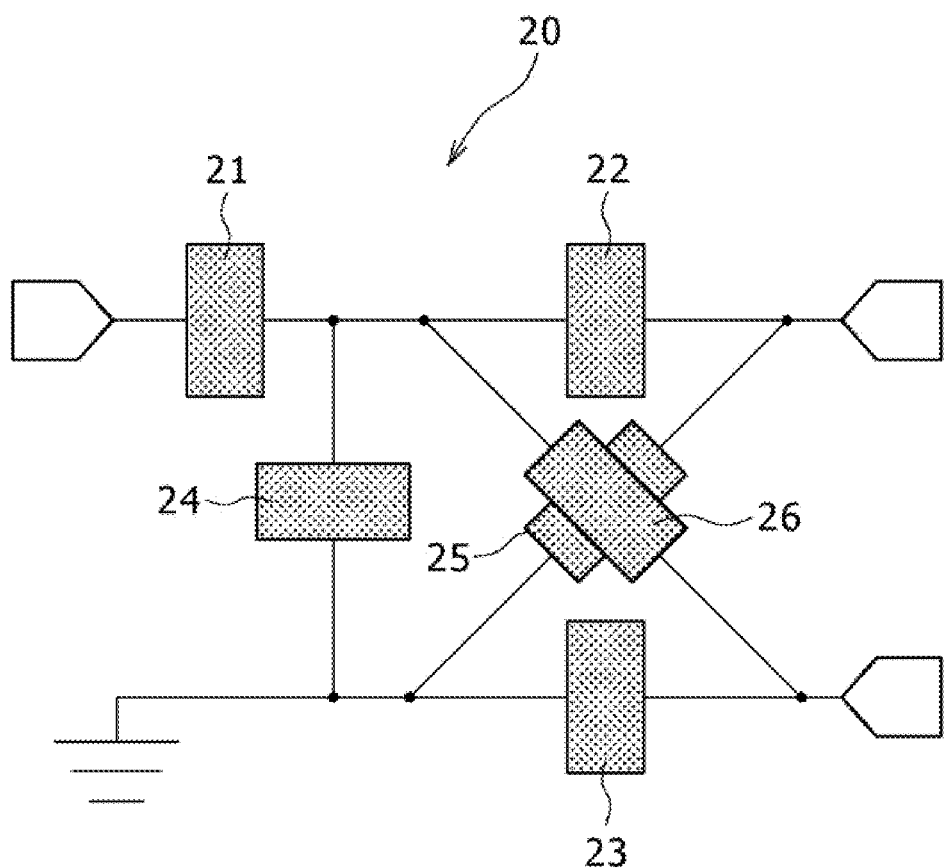
FIG. 2 is a circuit diagram of a band-pass filter element.
Figure 3:
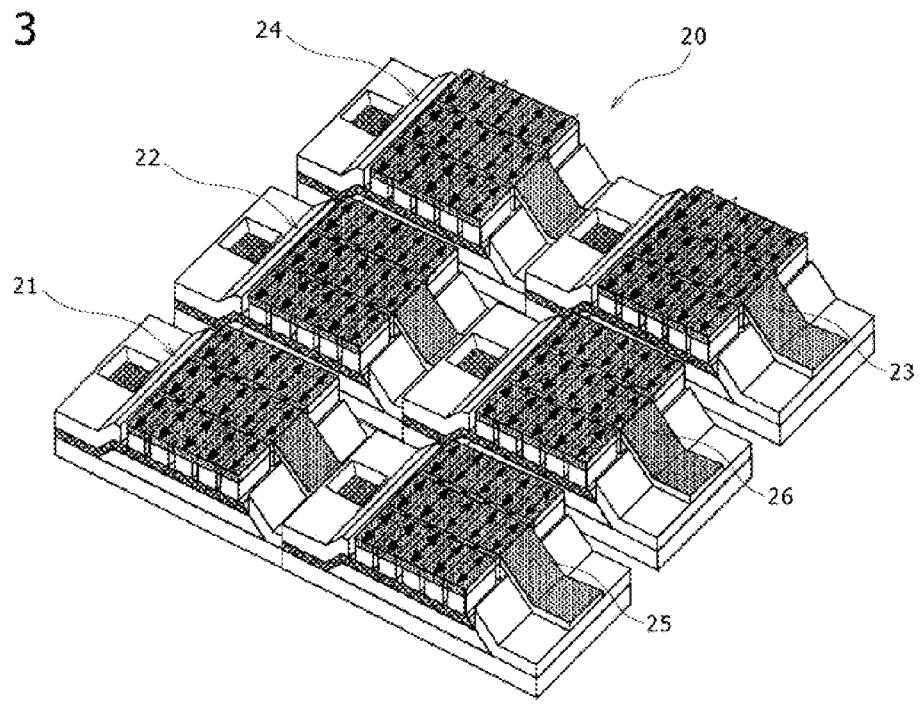
FIG. 3 is a schematic perspective view of band-pass filter elements.

As shown in FIG. 2 and FIG. 3, the band-pass filter element 20 has a basic circuit configuration of a ladder circuit (1×1) having the piezoelectric resonators 21 to 23 and a lattice circuit (2×2) having the piezoelectric resonators 24 to 26.

The piezoelectric resonators 21 to 26 used in the band-pass filter element 20 will be described with reference to FIG. 4 and FIG. 5. FIG. 4 and FIG. 5 show the piezoelectric resonator 21 as a representative. The other piezoelectric resonators 22 to 26 are basically of the same configuration as the piezoelectric resonator 21. Incidentally, FIG. 5 mainly shows a piezoelectric film and electrodes disposed on the upper and lower surfaces of the piezoelectric film.

Figure 4:
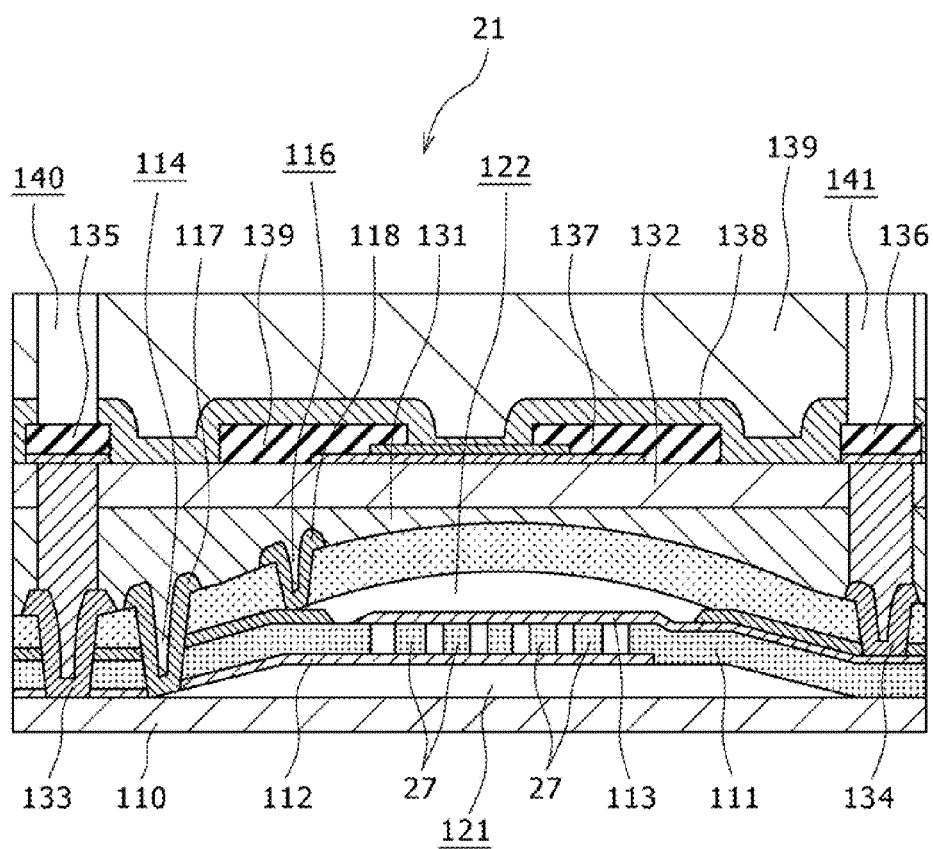
FIG. 4 is a schematic sectional view of a piezoelectric resonator.
Figure 5:
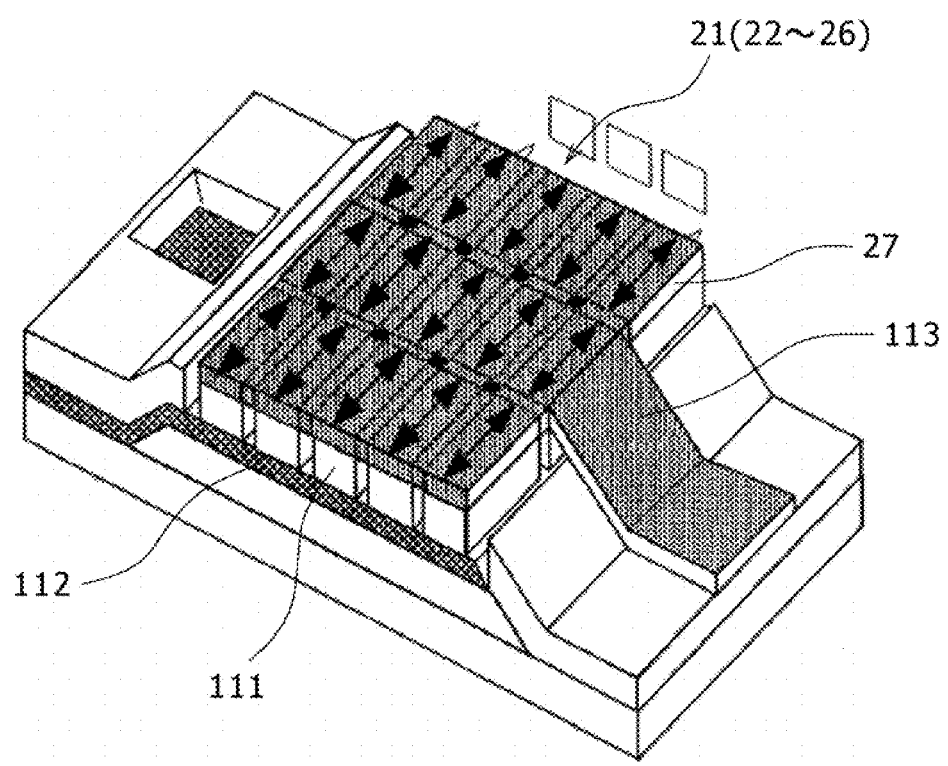
FIG. 5 is a schematic perspective view of the piezoelectric resonator.

As shown in FIG. 4 and FIG. 5, the piezoelectric resonator 21 has a piezoelectric film 111 formed so as to form a lower space 121 on a substrate 110. This piezoelectric film 111 is formed by an aluminum nitride film, for example.

The piezoelectric resonator 21 also has a first electrode 112 in contact with the lower surface of the piezoelectric film 111 and a second electrode 113 that is in contact with the upper surface of the piezoelectric film 111 and which has a part overlapping the first electrode 112. The first electrode 112 and the second electrode 113 are formed by a molybdenum film, for example.

The piezoelectric film 111 may be divided into a plurality of parts. The divided parts of the piezoelectric film 111 each form a micro-resonator element 27.

A first through hole 114 communicating with the lower space 121 is formed in a region having an inclined surface of the piezoelectric film 111 including the first electrode 112 and the second electrode 113. In addition, an upper space forming film 115 that forms an upper space 122 and in which a second through hole 116 communicating with the upper space 122 is formed is formed on the inclined surface on the upper surface side of the piezoelectric film 111.

Further, a first sealing layer 117 is formed so as to fill the first through hole 114, and a second sealing layer 118 is formed so as to fill the second through hole 116. The first sealing layer 117 is formed such that a part of the first sealing layer 117 is in contact with the substrate 110 as a foundation through the first through hole 114. The second sealing layer 118 is formed such that a part of the second sealing layer 118 is in contact with the piezoelectric film 111 as a foundation through the second through hole 116.

An interlayer insulating film 131, a planarizing film 132 and the like are formed on the upper space forming film 115, and contact parts 133 and 134 connected to the first electrode 112 and the second electrode 113 are formed. Wiring 135 and 136 connected to the contact parts 133 and 134 is formed, and other wiring 137 and the like are formed.

Further, insulating films 138 and 139 covering the wiring 135 to 137 are formed. Connecting holes 140 and 141 communicating with the wiring 135 and 136 connected to the contact parts 133 and 134 are formed in the insulating films 138 and 139.

A resonance mode can be changed by varying length in a one-dimensional direction of the micro-resonator element 27. The resonance mode of the piezoelectric resonator 21 (22 to 26) can be changed by varying the length of the individual micro-resonator elements, for example, in a direction of arrows in FIG. 5.

Figure 6:
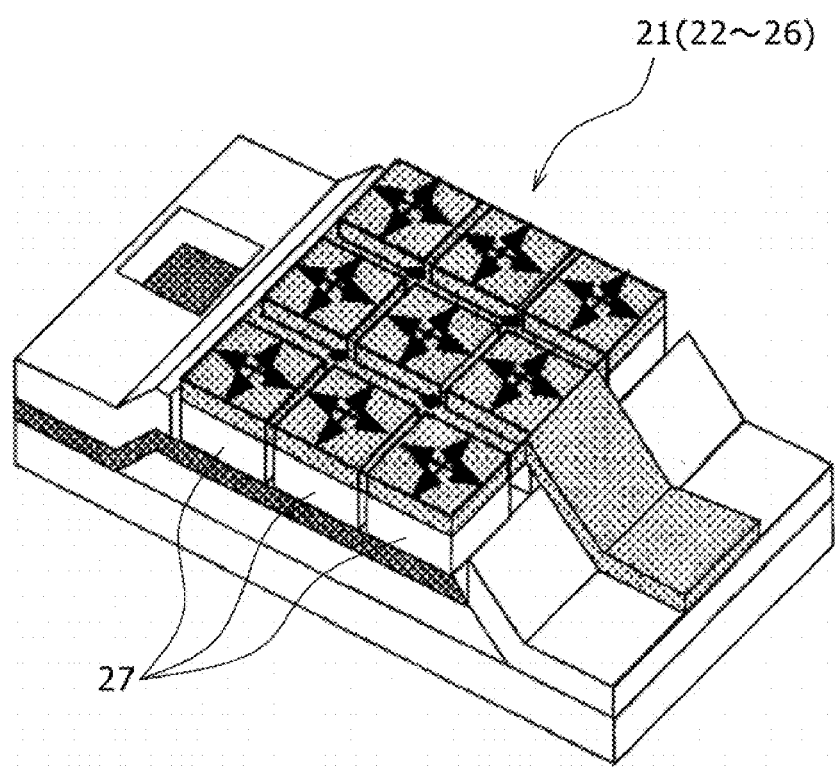
FIG. 6 is a schematic perspective view of the piezoelectric resonator.

In addition, as shown in FIG. 6, the resonance mode can be changed by varying length in two-dimensional directions of the micro-resonator element 27. The resonance mode of the piezoelectric resonator 21 (22 to 26) can be changed by varying the length of the individual micro-resonator elements 27, for example, in directions of arrows in FIG. 6.

The band-pass filter device 10 can provide a large number of band-pass filters composed of piezoelectric resonators formed by thin films having respective different resonance frequencies corresponding to all channels of current television.

A concrete embodiment will next be described by taking a television channel filter for terrestrial digital broadcasting in Japan as an example.

For example, an example of a circuit of a concrete band-pass filter element 20 having a center frequency of 476 MHz and forming a channel bandwidth of 6 MHz and the design values of micro-resonator elements forming the circuit will be described with reference to FIG. 7 and FIG. 8.

Figure 7:
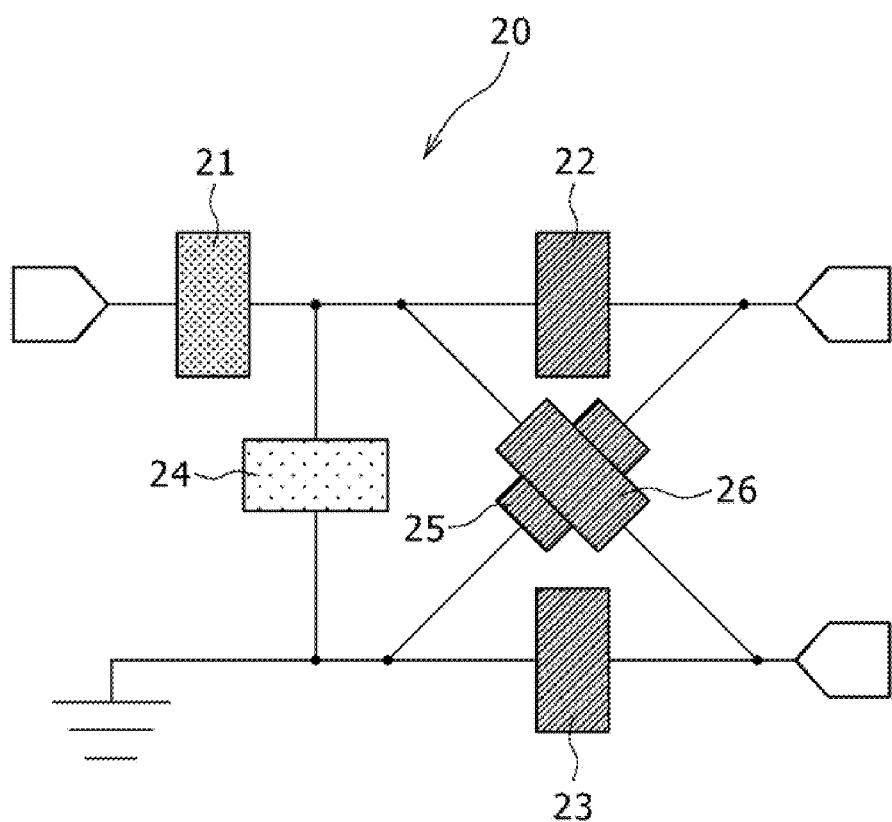
FIG. 7 is a circuit diagram of a band-pass filter element.

As shown in FIG. 7, the piezoelectric resonators 21 to 26 have three kinds of capacitances Cx, Cy, and Co. In this case, for example, the piezoelectric resonator 21 has a capacitance Cx, the piezoelectric resonator 24 has a capacitance Cy, and the piezoelectric resonators 22, 23, 25, and 26 have a capacitance Co. Suppose, for example, that Cx=9.54 pf, Cy=4.77 pf, and Co=6.75 pf. The three kinds of capacitances can be changed by adjusting the length in a one-dimensional direction of resonator elements.

In addition, as shown in FIG. 8, the piezoelectric resonators 21 to 26 have two kinds of resonance frequencies frX and frY. In this case, for example, the piezoelectric resonators 21, 22, and 23 are formed with a capacitance having a resonance frequency frX, and the piezoelectric resonators 24, 25, and 26 are formed with a capacitance having a resonance frequency frY. For example, the piezoelectric resonators 21, 22, and 23 are formed with a capacitance having a resonance frequency frX such that fr=471.80 MHz and fa=474.80 MHz, and the piezoelectric resonators 24, 25, and 26 are formed with a capacitance having a resonance frequency frY such that fr=477.30 MHz and fa=480.4 MHz. The two kinds of resonance frequencies can be changed by adjusting the length in a one-dimensional direction (length in a direction of arrows) of resonator elements.

For example, the resonance mode length of the piezoelectric resonators 21, 22, and 23 is designed such that fr=477.30 MHz, the length L of the piezoelectric film formed by aluminum nitride=8.736 μm, a capacitance area (=the total area of the micro-resonator elements 27) SC=89772.9 μm$^2$, the thickness ta of the piezoelectric film 111 formed by aluminum nitride=1000 nm, the film thickness t1 of the first electrode 112 formed by molybdenum on the lower part of the piezoelectric film=334 nm, and the film thickness t2 of the second electrode 113 formed by molybdenum on the upper part of the piezoelectric film=334 nm.

In addition, the resonance mode length of the piezoelectric resonators 24, 25, and 26 is designed such that, for example, fr=471.8 MHz, the length L of the piezoelectric film formed by aluminum nitride=8.864 μm, a capacitance area (=the total area of the micro-resonator elements 27) SC=126958.1 μm$^2$, the thickness ta of the piezoelectric film 111 formed by aluminum nitride=1000 nm, the film thickness t1 of the first electrode 112 formed by molybdenum on the lower part of the piezoelectric film=334 nm, and the film thickness t2 of the second electrode 113 formed by molybdenum on the upper part of the piezoelectric film=334 nm.

The band-pass filter element 20 of the above-described configuration increases a frequency difference between antiresonance frequency of series resonator elements of the piezoelectric resonators 21 to 23 of the ladder type circuit and the lattice type circuit and resonance frequency of shunt resonator elements of the piezoelectric resonators 21 to 23 as the frequency of the channel is varied from a low-frequency side to a high-frequency side.

As for the resonator element capacitance of the piezoelectric resonators 21 to 26 forming the band-pass filter element 20, resonance frequency can be changed by, for example, fixing a ratio between series capacitance and shunt capacitance of the piezoelectric resonator elements of the lattice type circuit at one and varying a ratio between series capacitance and shunt capacitance of the ladder type circuit.

Figure 9:
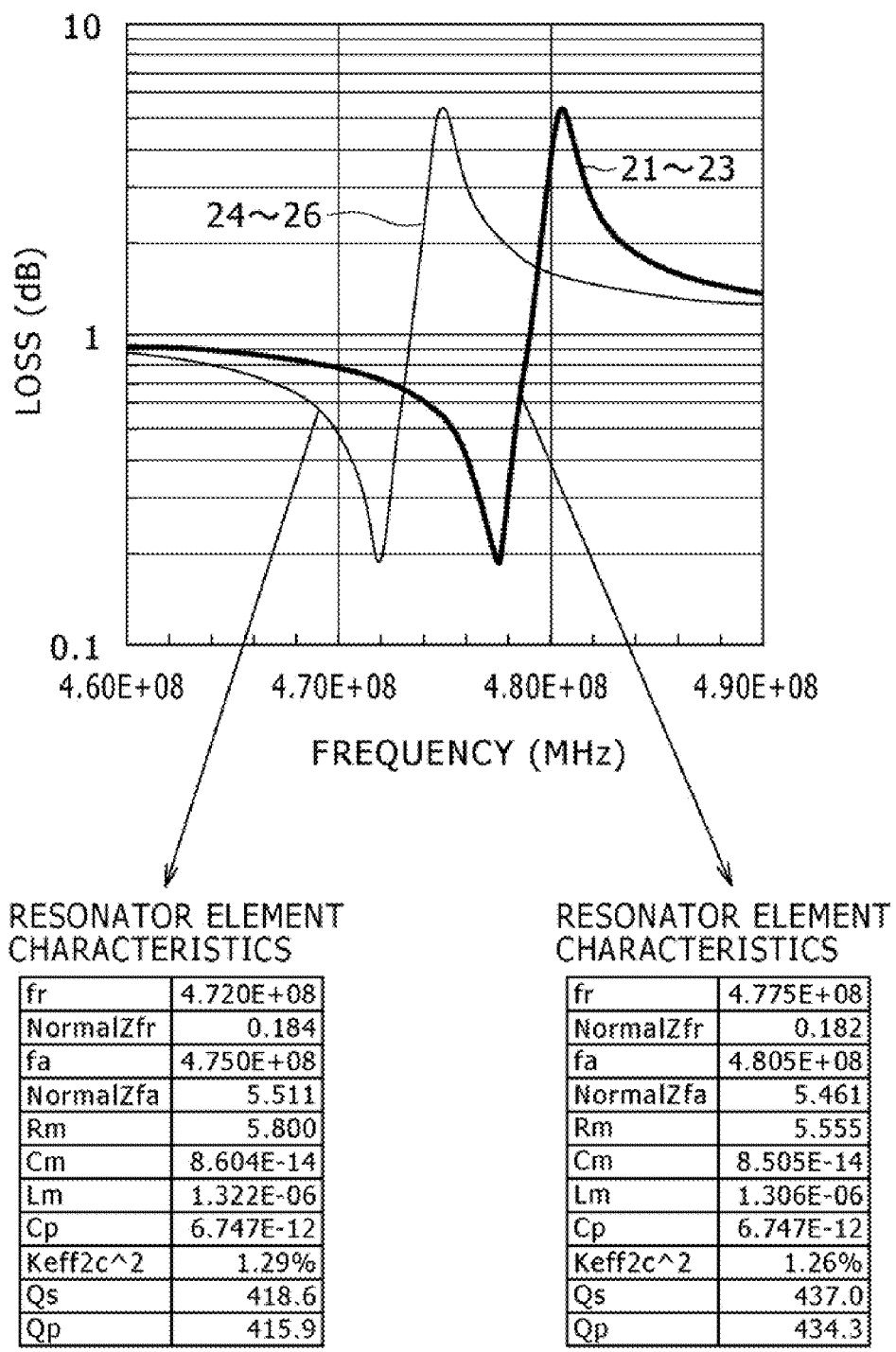
FIG. 9 is a diagram of frequency characteristics.
Figure 10:
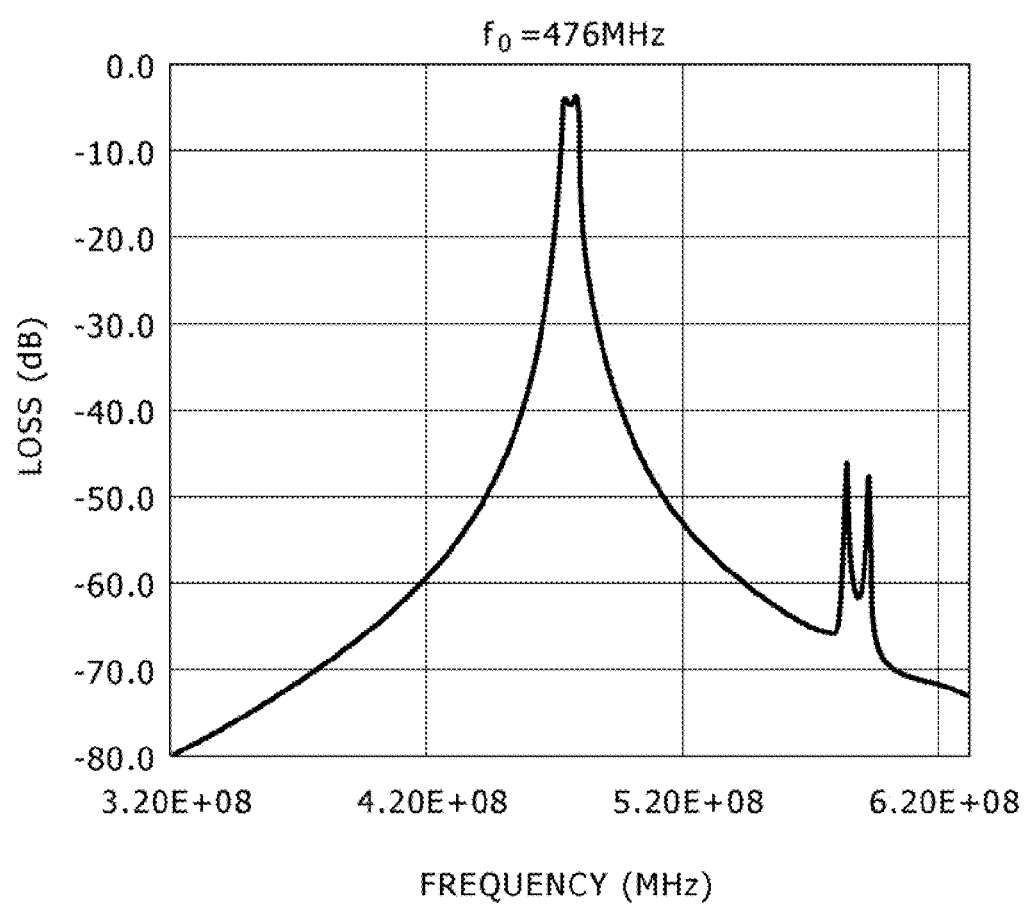
FIG. 10 is a diagram of frequency characteristics.
Figure 11:
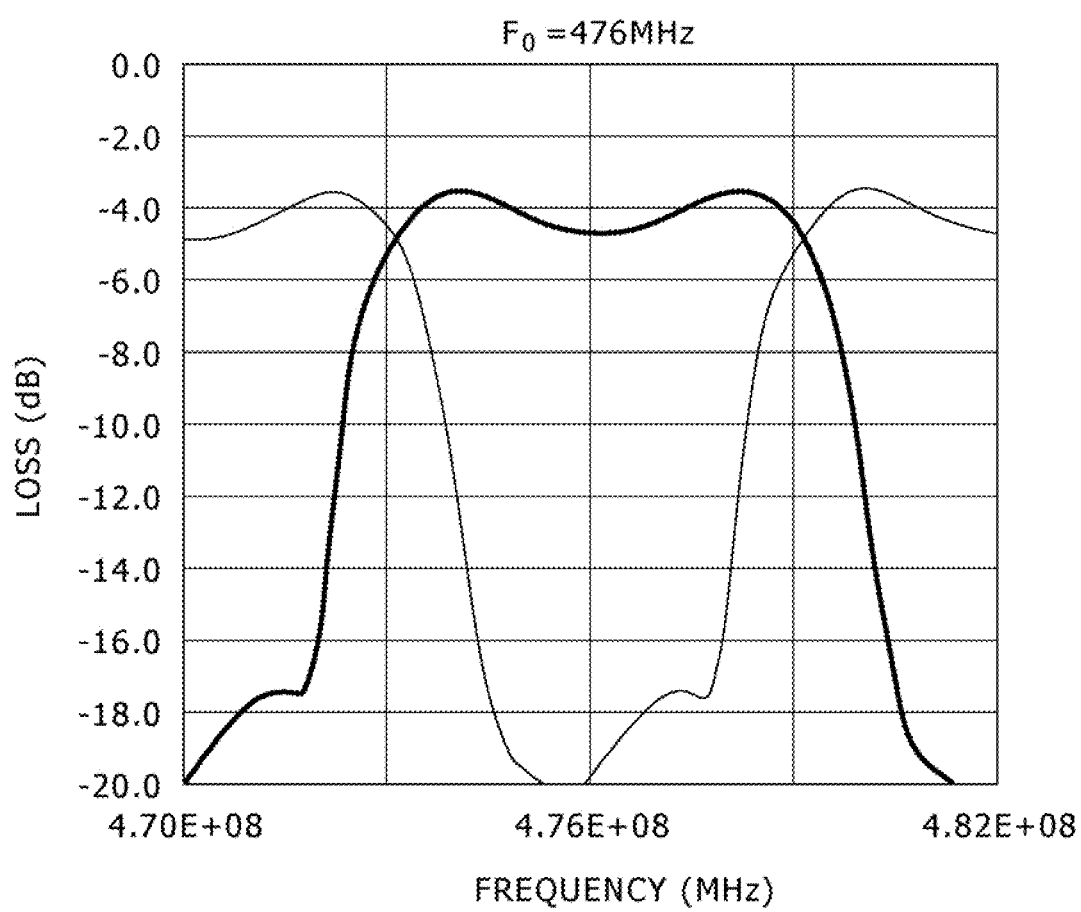
FIG. 11 is a diagram of frequency characteristics.

The piezoelectric resonators 21 to 26 have resonator element characteristics as shown in FIGS. 9 to 11.

FIG. 9 shows resonance characteristics of resonator elements in a length mode which elements form a filter. FIG. 10 shows band-pass characteristics of the filter whose circuit is formed by these resonator elements. FIG. 11 shows attenuation characteristics of adjacent channels. As shown in FIG. 10 and FIG. 11, frequency characteristics of adjacent frequencies exhibit similar frequency characteristics even in a case of frequencies in a wider range. That is, a similar waveform is obtained in a state of being shifted by a bandwidth.

The above-described frequency characteristics are obtained with the center frequency fo=476 MHz, bandwidth=6 MHz, a ripple=1.6 dB, an insertion loss=5.2 dB, an amount of attenuation of adjacent channels (central position of each channel)=20 dB, and fo=±100 MHz attenuation>60 dB.

A configuration that changes a resonance mode by the area of resonator elements will next be described with reference to FIGS. 12 to 14.

As shown in FIG. 12, a band-pass filter element 20 has a basic circuit configuration of a ladder circuit (1×1) having piezoelectric resonators 21 to 23 and a lattice circuit (2×2) having piezoelectric resonators 24 to 26.

A resonance mode can be changed by varying length in two-dimensional directions of above-described micro-resonator elements 27. The resonance mode of the piezoelectric resonator 21 (22 to 26) can be changed by varying the area of predetermined micro-resonator elements 27, for example, in directions of arrows in FIG. 12.

The band-pass filter device 10 can also be formed by using the above-described band-pass filter element 20. The band-pass filter device can provide a large number of band-pass filters composed of piezoelectric resonators formed by thin films having respective different resonance frequencies corresponding to all channels of current television.

A concrete embodiment of a television channel filter for terrestrial digital broadcasting in Japan when the band-pass filter element 20 is used will next be described.

For example, an example of a circuit of a concrete band-pass filter element 20 having a center frequency of 476 MHz and forming a channel bandwidth of 6 MHz and the design values of resonator elements forming the circuit will be described with reference to FIG. 13 and FIG. 14.

As shown in FIG. 13 and FIG. 14, the piezoelectric resonators 21 to 26 have two kinds of micro-resonator element total areas SC1 and SC2. In this case, for example, the piezoelectric resonators 21, 22, and 23 have a micro-resonator element total area SC1, and the piezoelectric resonators 24, 25, and 26 have a micro-resonator element total area SC2. For example, the micro-resonator element total area SC1=239970.9 μm$^2$, and the micro-resonator element total area SC2=558303.3 μm$^2$. The two kinds of micro-resonator element total areas can be changed by adjusting the length in two-dimensional directions (length in directions of arrows) of resonator elements.

For example, the piezoelectric resonators 21, 22, and 23 are designed such that the length L of the piezoelectric film formed by aluminum nitride of the micro-resonator elements 27=27315 μm, the capacitance area (=the total area of the micro-resonator elements 27) SC1=239970.9 μm$^2$, the thickness ta of the piezoelectric film 111 formed by aluminum nitride=1000 nm, the film thickness t1 of the first electrode 112 formed by molybdenum on the lower part of the piezoelectric film=334 nm, and the film thickness t2 of the second electrode 113 formed by molybdenum on the upper part of the piezoelectric film=334 nm.

In addition, the piezoelectric resonators 24, 25, and 26 are designed such that the length L of the piezoelectric film formed by aluminum nitride of the micro-resonator elements 27=28350 nm, the capacitance area (=the total area of the micro-resonator elements 27) SC2=558303.3 μm$^2$, the thickness ta of the piezoelectric film 111 formed by aluminum nitride=1000 nm, the film thickness t1 of the first electrode 112 formed by molybdenum on the lower part of the piezoelectric film=334 nm, and the film thickness t2 of the second electrode 113 formed by molybdenum on the upper part of the piezoelectric film=334 nm.

Figure 15:
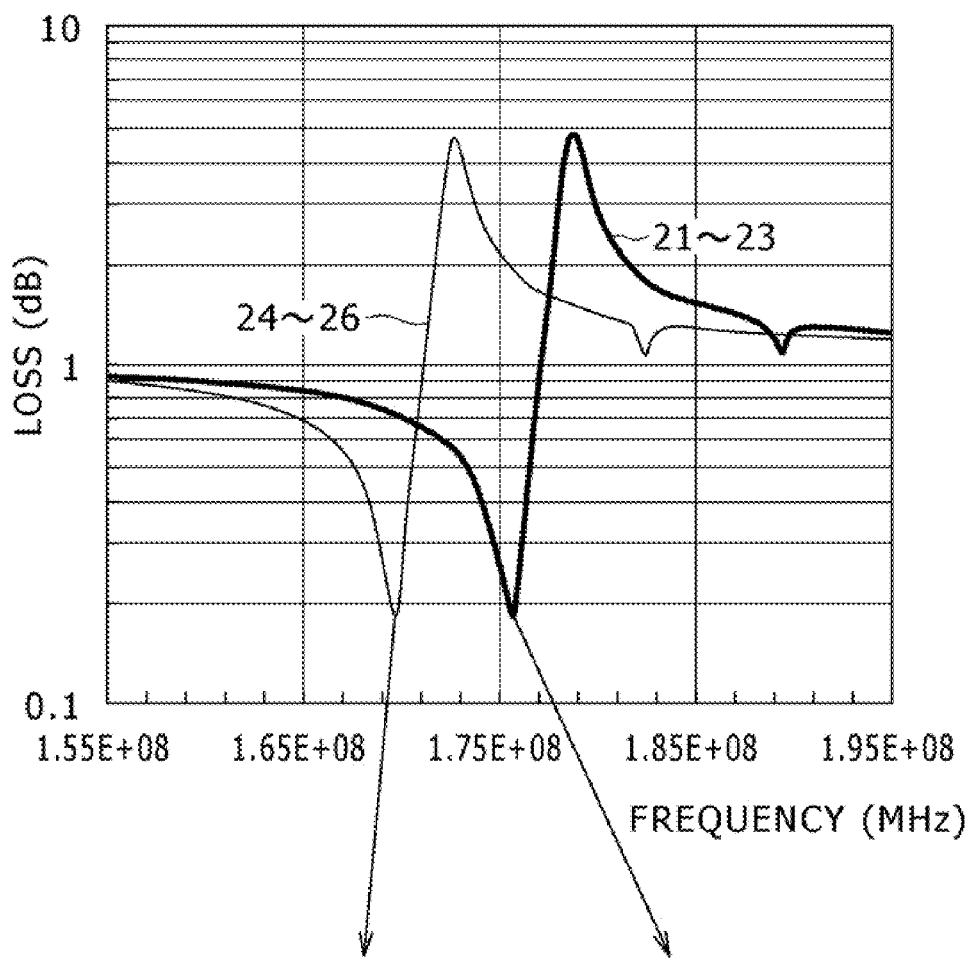
FIG. 15 is a diagram of frequency characteristics.
Figure 16:
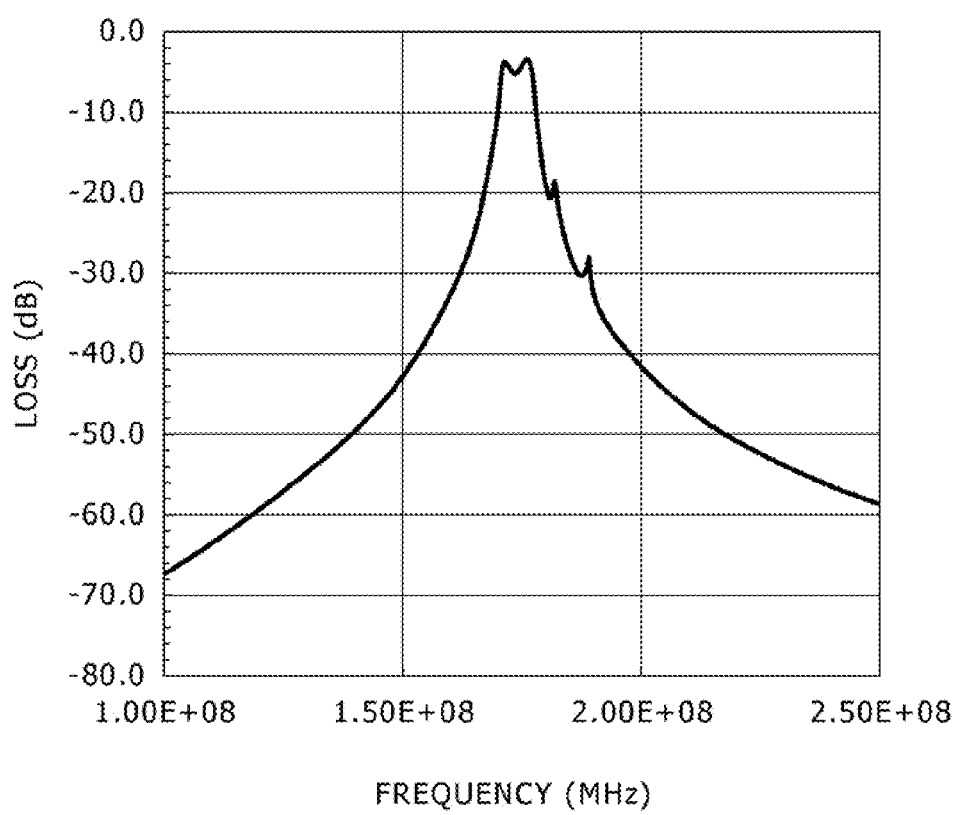
FIG. 16 is a diagram of frequency characteristics.
Figure 17:
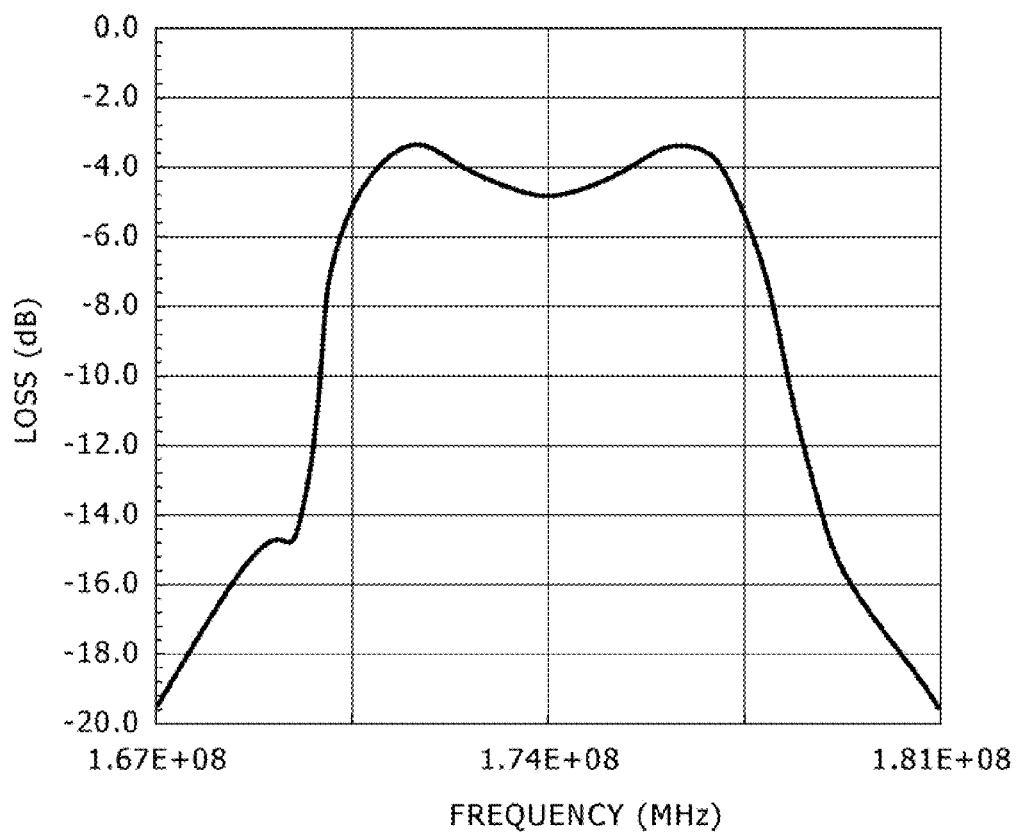
FIG. 17 is a diagram of frequency characteristics.

The piezoelectric resonators 21 to 26 have resonator element characteristics as shown in FIGS. 15 to 17.

FIG. 15 shows resonance characteristics of resonator elements in an area mode which elements form a filter. FIG. 16 shows band-pass characteristics of the filter whose circuit is formed by these resonator elements. FIG. 17 shows attenuation characteristics of adjacent channels. As shown in FIG. 16 and FIG. 17, frequency characteristics of adjacent frequencies exhibit similar frequency characteristics even in a case of frequencies in a wider range. That is, a similar waveform is obtained in a state of being shifted by a bandwidth.

The above-described frequency characteristics are obtained with a center frequency fo 174 MHz, bandwidth=7 MHz, a ripple=1.6 dB, an insertion loss=5.0 dB, an amount of attenuation of adjacent channels (central position of each channel)=18 dB, and fo=±100 MHz attenuation>60 dB.

Figure 18:
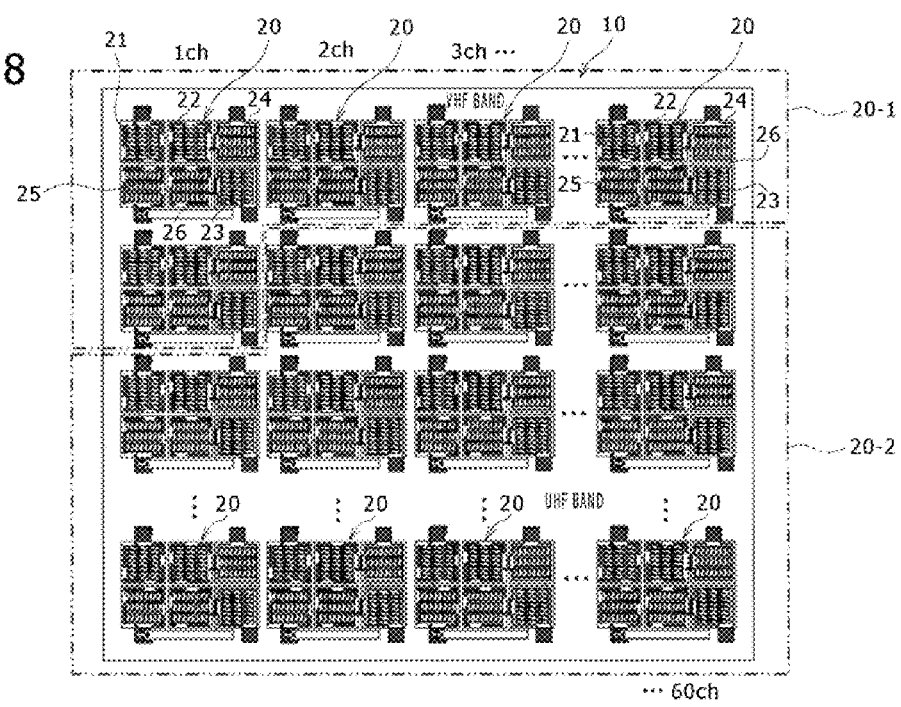
FIG. 18 is a schematic plan layout view of an embodiment of a band-pass filter device.

An example of application of a band-pass filter device according to an embodiment will next be described with reference to a schematic plan layout view of FIG. 18. FIG. 18 is a perspective view of an example in which the band-pass filter device is applied to a VHF band and a UHF band.

As shown in FIG. 18, the band-pass filter device 10 has a plurality of band-pass filter elements 20 on a principal plane of a substrate 11. The band-pass filter elements 20 correspond to a plurality of respective channels divided by frequency regions. Each of the band-pass filter elements 20 is, for example, composed of a plurality of piezoelectric resonators 21 to 26. In an example shown in the drawing, band-pass filter elements 20 are provided for 60 channels, for example. The drawing shows a part of the band-pass filter elements 20. As the band-pass filter elements 20, band-pass filter elements similar to those described above can be used.

In the band-pass filter device 10, a first band-pass filter element group 20-1 formed by a plurality of band-pass filter elements 20 has a resonance mode corresponding to the VHF band.

A second band-pass filter element group 20-2 formed by a plurality of band-pass filter elements 20 has a resonance mode corresponding to the UHF band.

Figure 20:
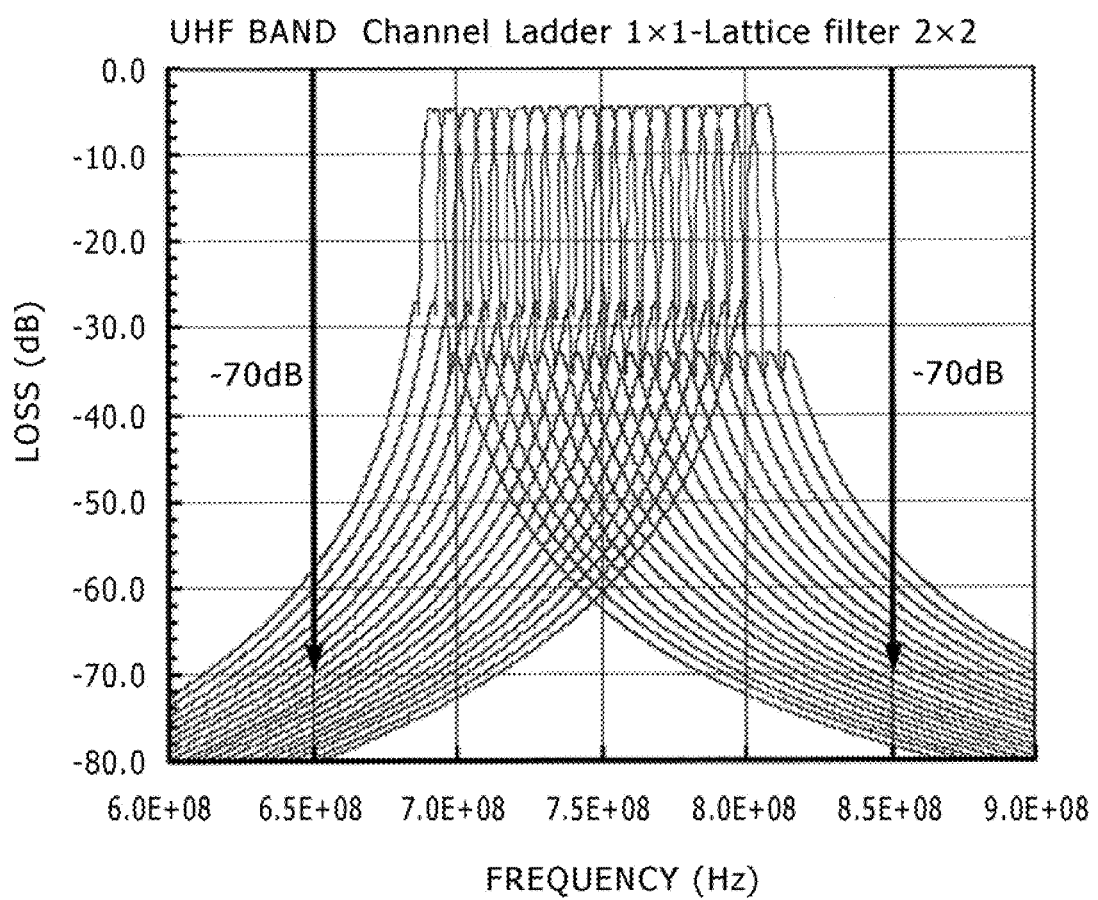
FIG. 20 is a diagram of frequency characteristics.

For example, pass characteristics of the channel filter on a high-frequency side of the UHF band for terrestrial digital broadcasting in Japan are as shown in FIG. 19 and FIG. 20, for example.

Figure 22:
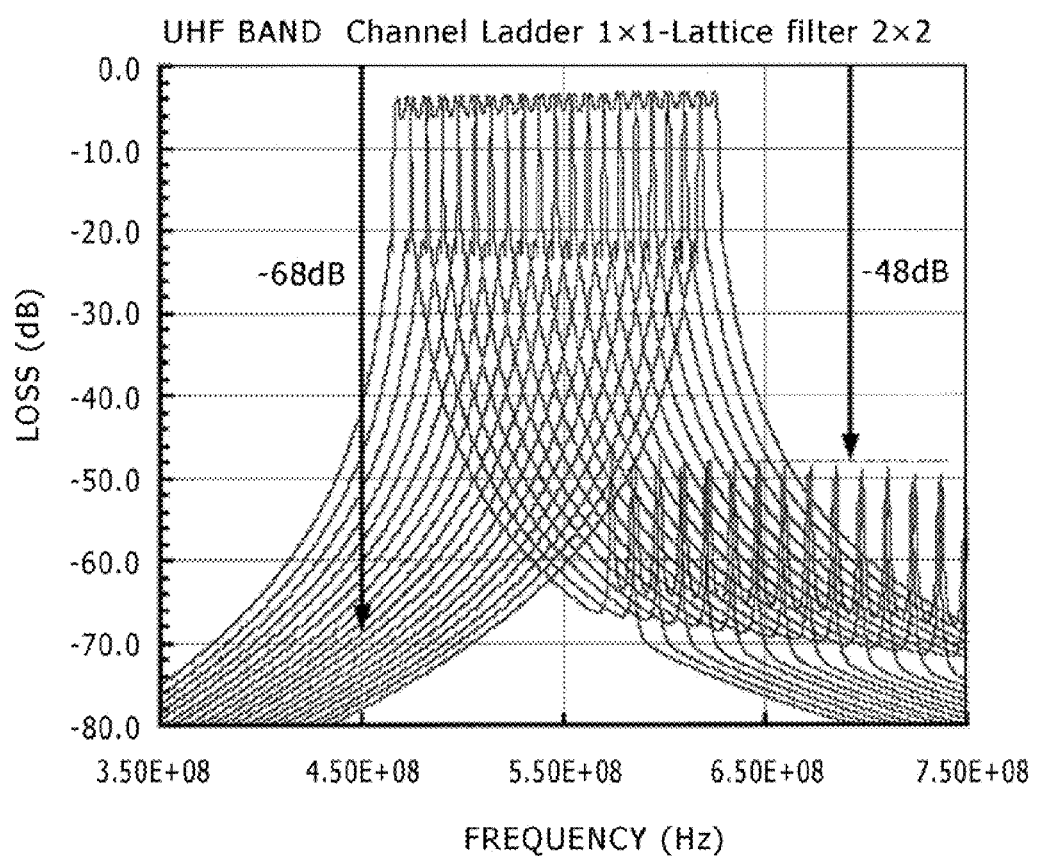
FIG. 22 is a diagram of frequency characteristics.

Pass characteristics of the channel filter on a low-frequency side of the UHF band for terrestrial digital broadcasting in Europe are as shown in FIG. 21 and FIG. 22, for example. Pass characteristics of the channel filter on a high-frequency side of the UHF band are as shown in FIG. 19 and FIG. 20 mentioned above, for example.

The piezoelectric film 111 of the piezoelectric resonators 21 to 26 described above is desirably formed by a laminated film made by laminating a tensile stress film and a compressive stress film. The band-pass filter elements 20 in different resonance modes are sequentially arranged from a low-frequency side to a high-frequency side of channel frequencies and from a region of a large fractional bandwidth to a region of a small fractional bandwidth of channels in decreasing order of an electromechanical coupling factor (k) specific to each resonance mode. This arrangement can be applied to the arrangement of the band-pass filter elements 20 shown in FIG. 1 described above.

A reciprocal stress piezoelectric film structure described above (a structure in which a compressive stress film and a tensile stress film are alternately laminated in the identical film structure and both stresses are balanced with each other in the film as a whole) makes it possible to realize a lateral direction electromechanical coupling factor (keff), which is impossible at present.

In addition, as described above with reference to FIG. 5 and FIG. 6, the piezoelectric film 111 may be divided into a plurality of parts. That is, a plurality of micro-resonator elements 27 may be formed.

Letting Co be the capacitance of the micro-resonator elements 27, fo be the center frequency of the band-pass filter elements 20, and Z be the matching impedance of the band-pass filter, the number N of micro-resonator elements 27 mentioned above is $N=1/(2\pi \times fo \times Co \times Z)$. The above-described N is an integer.

For example, the resonance frequency of resonator elements in a capacitance region all corresponding to a fractional part varies from a target frequency (the resonance frequency is defined by dimensions), N is desirably an integer in order to suppress the variation.

When the above-described N is a number having a fractional part, N is made to be an integer by changing the vibration of the resonator elements in the capacitance region corresponding to the fractional part. For example, when a piezoelectric resonator performs length vibration, the length of resonator elements of the piezoelectric resonator is shortened to suppress the vibration. When a piezoelectric resonator performs area vibration, the area of resonator elements of the piezoelectric resonator is reduced. For example, a slit is formed in a peripheral part of a resonator element of the piezoelectric resonator to thereby separate the periphery of the resonator element, and vibration is suppressed by the separated peripheral part.

Thereby, the capacitance of the resonator elements and the impedance matching of the filter can be set independently of each other, and thus the matching of the filter can be achieved easily. The micro-resonator elements 27 of the length resonance mode or the area resonance mode can be electrically connected in parallel with each other at a high density, and one element can be realized by the multiple resonator elements.

The frequency bands of the plurality of band-pass filter elements 20 of the band-pass filter device 10 are set consecutively, and the plurality of band-pass filter elements 20 have a voltage applying source that applies, to a band-pass filter element channel-selected from the band-pass filter elements 20, a voltage for varying the frequency band of the band-pass filter element in a frequency range corresponding to ±½ of a channel bandwidth.

Thus, the channel band filter is changed by a switch, and the frequency range corresponding to ½ of the channel bandwidth is varied by voltage, whereby a desired channel is selected by one of the band-pass filter elements 20 arranged continuously.

The voltage applying source is connected to the first electrode 112 or the second electrode 113, and the applied voltage is controlled by an electric series voltage to the piezoelectric film 111.

The band-pass filter device 10 can handle a wide frequency range from the VHF band to the UHF band, for example, and a wide range of fractional bandwidths (%). It is also possible to realize a one-chip filter, and reduce a large number of external parts (coils and capacitors) that have been necessary in related art.

In addition, it is possible to achieve excellent filter characteristics that can attenuate element frequency regions including adjacent channels outside the pass band of one channel very sharply by the filter configuration of thin-film piezoelectric resonator elements as compared with filter characteristics of a related resonant circuit of a coil and a capacitor, greatly reduce the noise of a received channel, and perform high-quality reception.

Further, not only by a system that simply selects a group of filters arranged on a wafer by a switch, which has been proposed in related art, but also by changing the resonance frequency by ±½ of the channel band by control of direct-current voltage to thin-film piezoelectric resonator elements forming filters in a channel filter configuration which filters are arranged continuously on a frequency axis, a chip manufactured for specific channel frequencies can select all channel frequencies all over the world with a combination of the switch and the voltage control. Therefore, a need for complex individual designs for various countries is eliminated, so that low cost can be achieved.

An embodiment of a method of manufacturing a band-pass filter device according to the present application will next be described with reference to schematic sectional views of FIGS. 23A to 23M.

Because the band-pass filter device is composed of band-pass filter elements as aggregates of piezoelectric resonators, a method of manufacturing a piezoelectric resonator will be described in the following.

Figure 23A:
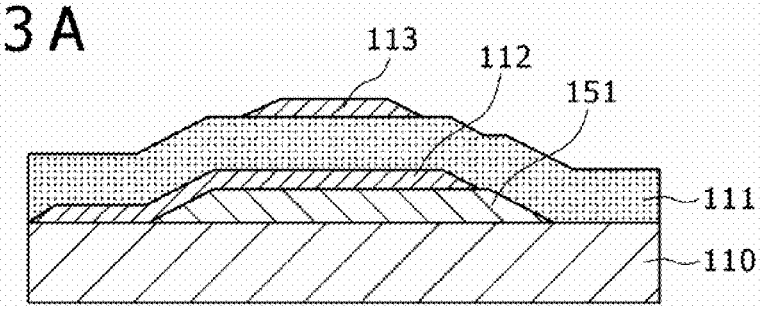
FIGS. 23A to 23M are manufacturing process sectional views of an embodiment of a method of manufacturing a piezoelectric resonator relating to a method of manufacturing a band-pass filter device.

As shown in FIG. 23A, an insulative substrate 110 using insulative silicon, glass or the like is prepared. This substrate 110 is, for example, a silicon (Si) substrate having a resistivity σ of 1000 Ωcm or more and a thickness of 600 µm. A first sacrifice layer 151 is formed on the substrate 110. The first sacrifice layer 151 is, for example, formed by depositing amorphous silicon doped with phosphorus (P) to 600 nm to 1200 nm, for example. A chemical vapor deposition method, for example, can be used for the film formation. The first sacrifice layer 151 is thereafter formed by patterning using lithography techniques and reactive ion etching (RIE) techniques. In etching at this time, tetrafluoromethane ($CF_4$), trifluoromethane ($CHF_3$), and oxygen ($O_2$) are used for an etching gas, and argon (Ar) is used for a carrier gas. The pressure of an etching atmosphere is set to 10 Pa, for example, and plasma generation supply power is set to 1500 W, for example.

Next, after a first electrode 112 is formed, a piezoelectric film 111 is formed, and a second electrode 113 is formed on the piezoelectric film 111. The second electrode 113 is formed such that at least a part of the second electrode 113 overlaps the first electrode 112 with the piezoelectric film 111 interposed between the second electrode 113 and the first electrode 112.

Figure 23B:
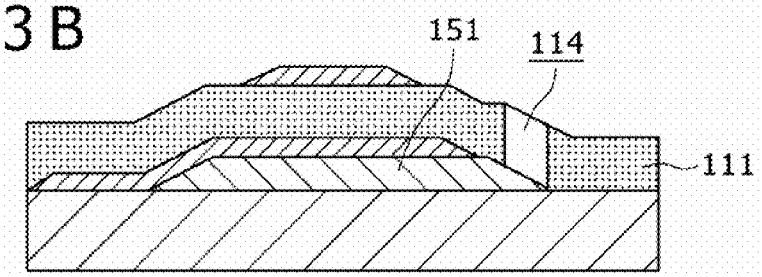

Next, as shown in FIG. 23B, a first through hole 114 for removing the first sacrifice layer 151 by selective etching is formed in a part of the piezoelectric film 111 in such a manner as to communicate with the first sacrifice layer 151.

Figure 23C:
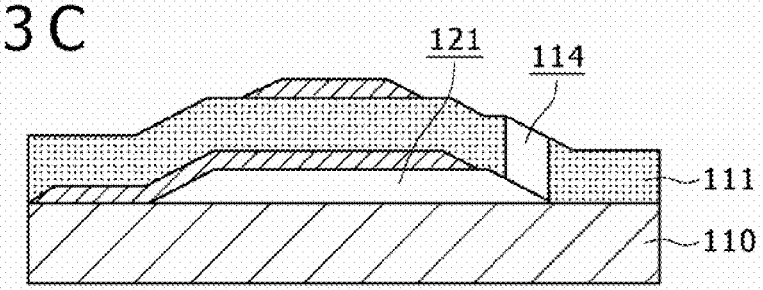

Next, as shown in FIG. 23C, only the first sacrifice layer 151 (see FIG. 23B) is selectively removed through the first through hole 114. Wet etching, for example, is used in this etching. A 10% wt hydrofluoric acid solution (solution temperature=30° C.), for example, is used as an etchant for the etching. Incidentally, when dry etching is performed, a hydrogen fluoride gas is used as an etching gas. As a result of the etching, a lower space 121 is formed between the piezoelectric film 111 and the substrate 110.

Figure 23D:
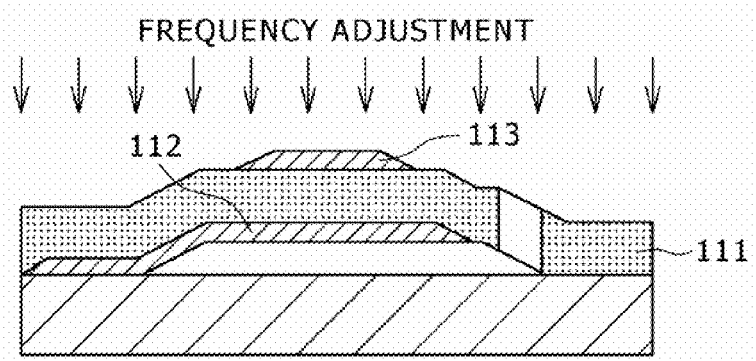

Next, as shown in FIG. 23D, the resonance frequency or frequency filter of a resonator element formed by the piezoelectric film 111, the first electrode 112, and the second electrode 113 or a circuit (not shown) formed of the resonator element is measured, and the measured resonance frequency or the measured frequency filter is adjusted. This frequency adjustment is made by irradiating the piezoelectric film 111 by reactive ion etching (RIE) or an ion beam method, for example. Because frequency adjustment can be thus performed during the process, it is possible to improve a yield and improve reliability.

Figure 23E:
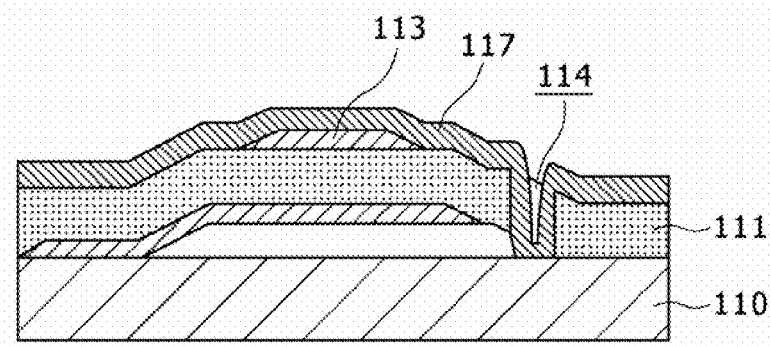

Next, as shown in FIG. 23E, a first sealing layer 117 is formed on the piezoelectric film 111 including the second electrode 113 in such a manner as to reach the surface of the substrate 110 through the first through hole 114. This first sealing layer 117 is formed by, for example, a pure aluminum metal or a compound including aluminum as a main ingredient. The aluminum compound includes, for example, Al-3% Cu and Al-3% Cu-1% Si. A sputtering method can be used for the film formation, and as for conditions for the film formation, for example, an argon (Ar) gas is supplied into a sputtering atmosphere at a flow rate of 150 $cm^3$/min, for example, a stage temperature is set at 300° C., and DC bias power is set at 1.5 kW. The first sealing layer 117 is formed with a sufficient film thickness to cover and fill the first through hole 114. For example, while the film thickness is 1000 µm when the first sealing layer 117 is an aluminum film, a film thickness of 500 to 2500 nm can be adopted according to the height of the lower space 121 and the film thickness of the piezoelectric film 111.

Figure 23F:
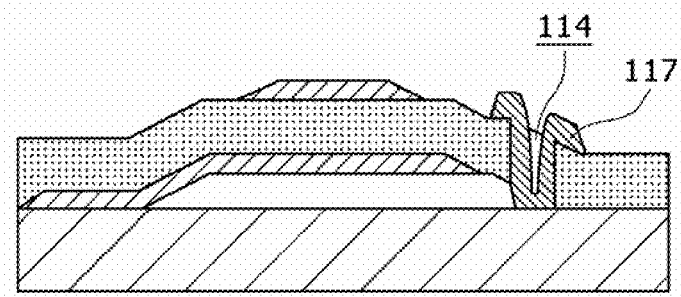

Next, as shown in FIG. 23F, the first sealing layer 117 is patterned by lithography and reactive ion etching, so that the first sealing layer 117 is left on the inside and the periphery of the first through hole 114 and the first sealing layer 117 on other parts is removed. In this reactive ion etching, a mixed gas of boron trichloride ($BCl_3$) and chlorine ($Cl_2$), for example, is used as an etching gas, the pressure of an etching atmosphere is set at 16 Pa, and a substrate bias is set at 60 W. With the above settings, vertical processing is performed using incident ion energy.

Figure 23G:
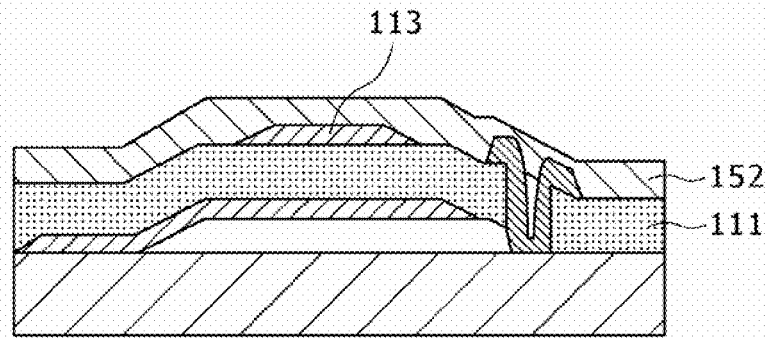

Next, as shown in FIG. 23G, a second sacrifice layer 152 is formed on the piezoelectric film 111 including the second electrode 113 in such a manner as to cover the first sealing layer.

Figure 23H:
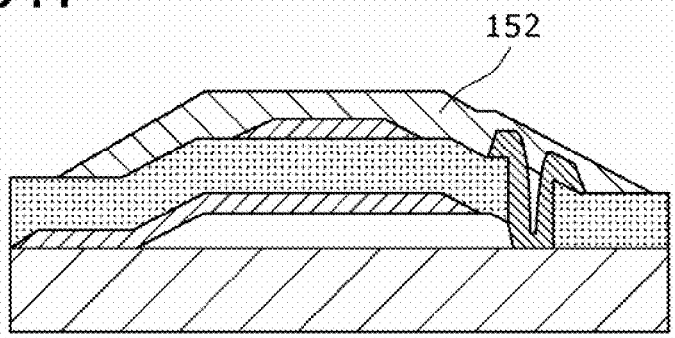

Next, as shown in FIG. 23H, the second sacrifice layer 152 is patterned by lithography and reactive ion etching. Etching conditions for this patterning are the same as the etching conditions of the first sacrifice layer 151.

Figure 23I:
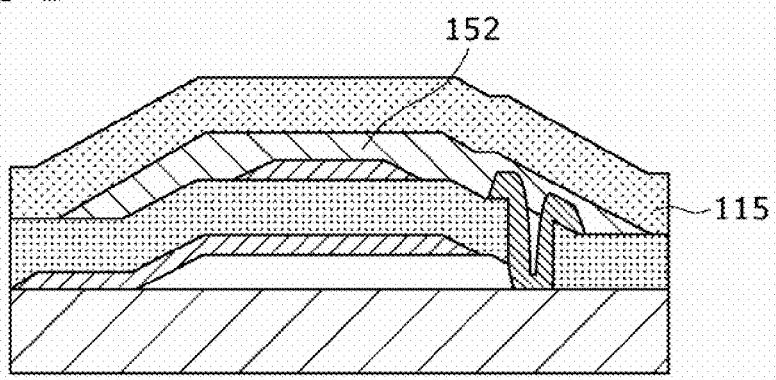

Next, as shown in FIG. 23I, an upper space forming film 115 is formed in such a manner as to cover the second sacrifice layer 152. A sputtering method, for example, is used for the film formation, and the upper space forming film 115 is formed by an aluminum nitride film or a silicon nitride film, for example. For example, the aluminum nitride film is formed to a thickness of 1500 nm. As for sputtering conditions at this time, a mixed gas of argon (Ar) and nitrogen ($N_2$) is used as a process gas, and a DC bias is set at 2.5 kW.

Figure 23J:
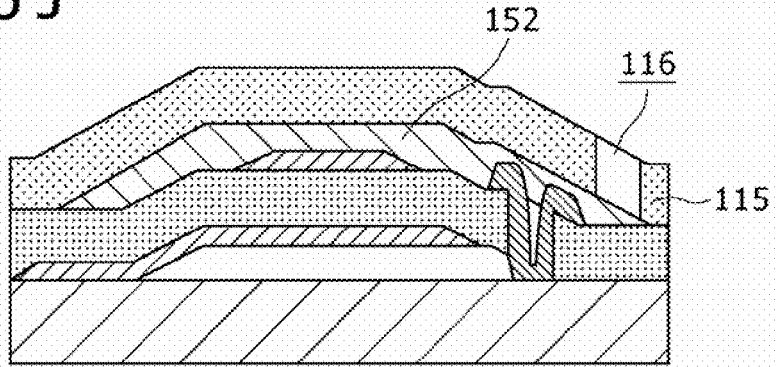

Next, as shown in FIG. 23J, a second through hole 116 for removing the second sacrifice layer 152 by selective etching is formed in a part of the upper space forming film 115 in such a manner as to communicate with the second sacrifice layer 152.

Figure 23K:
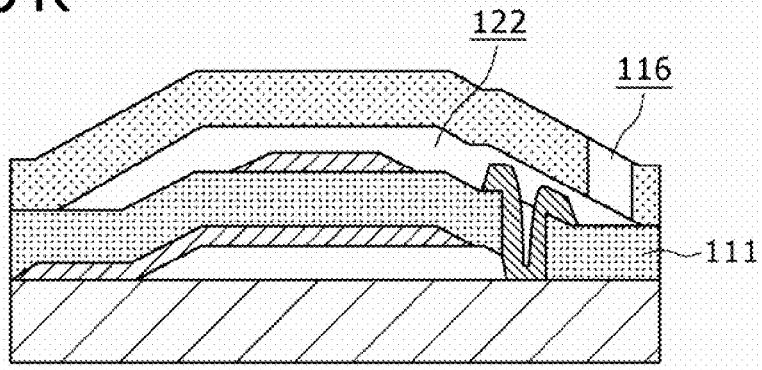

Next, as shown in FIG. 23K, using an etchant that can selectively dissolve and remove only the second sacrifice layer 152 (see FIG. 23J), the second sacrifice layer 152 is selectively dissolved and removed from the second through hole 116. A method of this etching uses a hydrofluoric acid solution with a dilution ratio of 10:1. Alternatively, the second sacrifice layer 152 can be removed by dry etching using a hydrogen fluoride (HF) gas. As a result, an upper space 122 is formed on the piezoelectric film 111 as a resonator element composed of the piezoelectric film 111, the first electrode 112, and the second electrode 113.

Figure 23L:
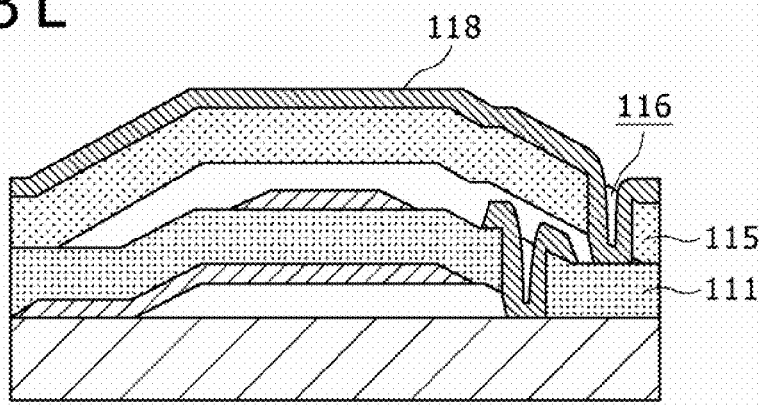

Next, as shown in FIG. 23L, a second sealing layer 118 is formed on the upper space forming film 115 in such a manner as to reach the surface of the piezoelectric film 111 through the second through hole 116. This second sealing layer 118 is formed by, for example, a pure aluminum metal or a compound including aluminum as a main ingredient. The aluminum compound includes, for example, Al-3% Cu and Al-3% Cu-1% Si. A sputtering method can be used for the film formation, and as for conditions for the film formation, for example, an argon (Ar) gas is supplied into a sputtering atmosphere at a flow rate of 150 cm$^3$/min, for example, a stage temperature is set at 300° C., and DC bias power is set at 1.5 kW.

Figure 23M:
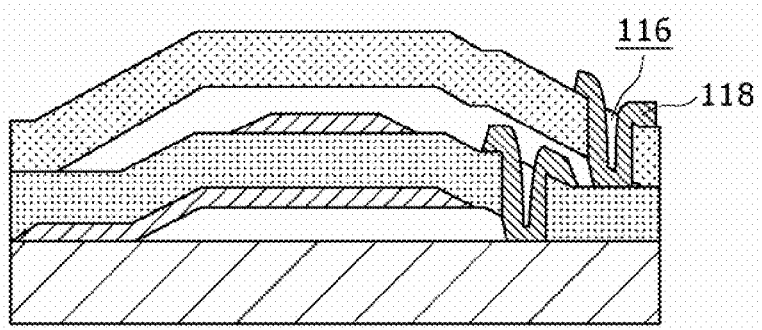

Next, as shown in FIG. 23M, the second sealing layer 118 is patterned by lithography and reactive ion etching, so that the second sealing layer 118 is left on the inside and the periphery of the second through hole 116 and the second sealing layer 118 on other parts is removed. In this reactive ion etching, a mixed gas of boron trichloride ($BCl_3$) and chlorine ($Cl_2$), for example, is used as an etching gas, the pressure of an etching atmosphere is set at 16 Pa, and a substrate bias is set at 60 W. With the above settings, vertical processing is performed using incident ion energy.

As described above, the method of manufacturing the piezoelectric resonator 21 in which the upper space 122 and the lower space 121 are formed and sealed on and under the resonant part of the resonator element can remove the first sacrifice layer 151 and the second sacrifice layer 152 in a considerably shorter time than the method in related art, and can include a step of adjusting frequency in the formation process. Further, these steps can be realized by a simple process. In addition, a need for airtight sealing in an expensive alumina package or the like as in the related case is eliminated. Thereby, a resonator that can be produced easily, provides a high yield, and is inexpensive can be obtained. In addition, because a need for airtight sealing of the resonator according to the present embodiment in an alumina package or the like is eliminated, the resonator according to the present embodiment can be formed thinly as in the case of the resonator in related art.

Piezoelectric resonators are formed by the above-described manufacturing method, and the piezoelectric resonators are formed on the same substrate 110 in such a manner as to take a circuit configuration as described above, whereby a band-pass filter element 20 is formed. Further, such band-pass filter elements 20 are formed on the same substrate 110 in such a manner as to correspond to the frequency bands of the respective channels, whereby a band-pass filter device 10 is formed.

In addition, the band-pass filter device 10 can be formed as one of a plurality of band-pass filter devices 10 on a wafer 200 as shown in a wafer layout plan view of FIG. 24, for example.

The method of manufacturing the band-pass filter device according to the foregoing embodiment forms the above-described piezoelectric film structure in each band-pass filter element 20, whereby length in a one-dimensional direction (length resonance mode) or length in two-dimensional directions (area resonance mode) of the piezoelectric film 111 interposed between the first electrode 112 and the second electrode 113 can be changed. Thus, the piezoelectric resonators 21 to 26 forming the band-pass filter element 20 for passing a desired frequency band are formed. In addition, the band-pass filter elements 20 can correspond to a plurality of respective channels divided by frequency regions. Thus, a plurality of band-pass filter elements 20 adjusted to frequency bands of television, for example, both the UHF band and the VHF band can be provided on a same substrate.

According to the manufacturing method, it is possible to adopt a filter bank system configuration, which is a band-pass filter device according to an embodiment, and form the filter bank system configuration on a wafer by a semiconductor process.

With a configuration in which the filter bank system is adopted in place of a tunable selecting filter, and all channels are arranged on a chip and selected by a switch, external parts (coils), which are currently mainstream, can be reduced. In addition, filter characteristics (exclusively selecting only a channel band of 6 to 8 MHz) that cannot be achieved theoretically by an LC filter can be achieved.

Resonator elements corresponding to a wide frequency range (VHF to UHF) can be formed en bloc (one mask).

Thereby, channel selection can be made by a switch and a DC bias, so that provision can be made for all specifications in the world.

It is possible to change a channel band filter by a switch, vary a frequency range corresponding to ½ of a channel bandwidth by voltage, and select a desired channel by one of filters arranged continuously.

This enables a reduction in cost as a result of remedying a reduction in yield due to a frequency shift caused by manufacturing variations, and enables selection of all frequency channels of terrestrial digital TV all over the world by electric operation with one channel band filter specification. Thus, manufacturing cost can be reduced.

In-line package techniques capable of manufacturing a low-cost package (PKG) by an FBAR process as described in the foregoing manufacturing method can be adopted.

As in many MEMS devices, in the channel band filter bank system, resonator elements are formed on a wafer. Therefore, a package of a hollow structure has thus far been necessary, and the adoption of a package of this hollow structure has invited an increase in manufacturing cost. A low-cost package can be realized by an in-line package, in which a hollow structure is formed within a chip itself by a semiconductor manufacturing process so that an ordinary inexpensive package can be adopted.

An embodiment of a television tuner will next be described with reference to a schematic circuit diagram of FIG. 25.

Figure 25:
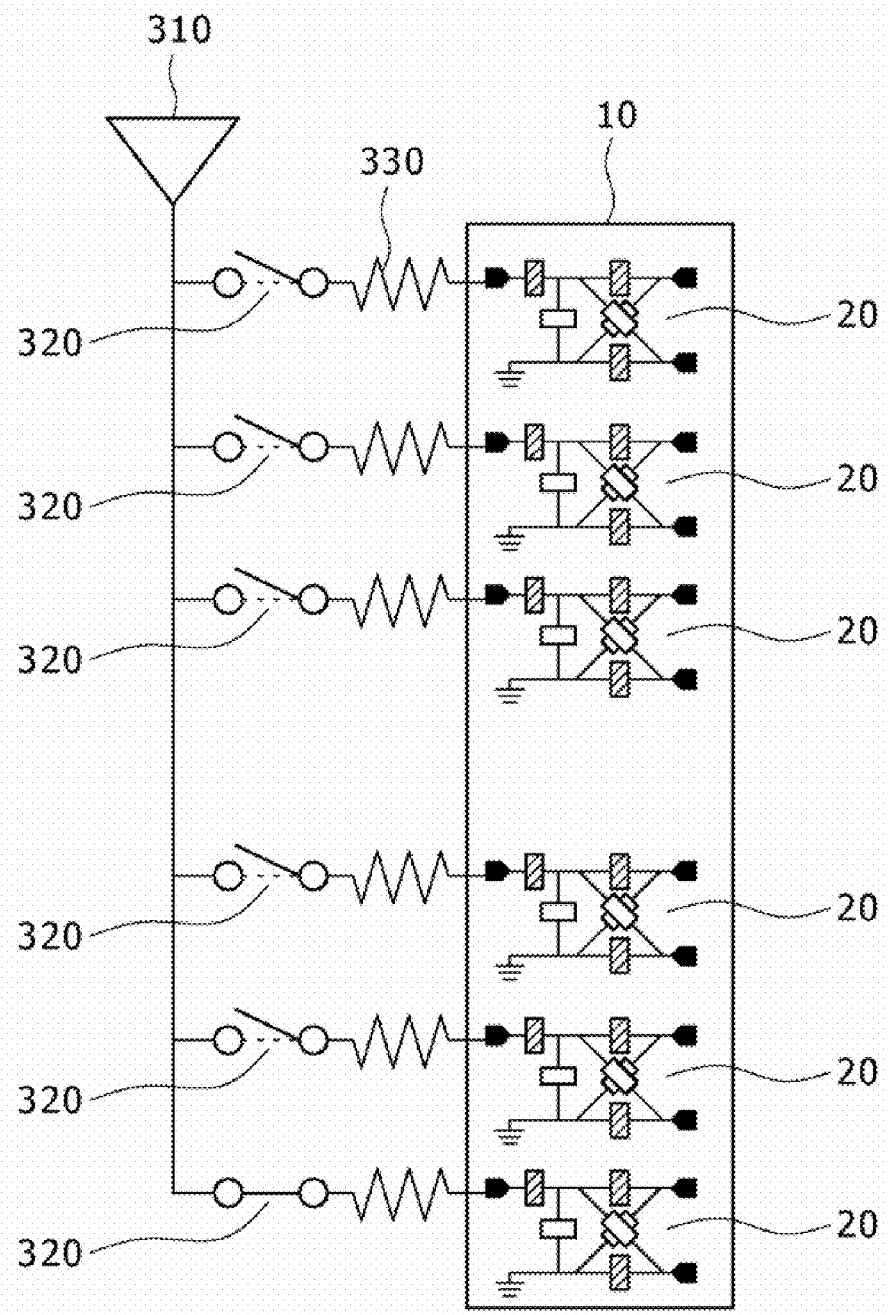
FIG. 25 is a circuit diagram showing an embodiment of a television tuner.

As shown in FIG. 25, a television tuner 300 has a plurality of switches 320 for selecting television signals received by an antenna 310, and has a band-pass filter device 10 corresponding to the switches 320.

Specifically, band-pass filter elements 20 of the band-pass filter device 10 are connected so as to correspond to the respective switches 320 via predetermined resistive elements 330. Of course, the input side of the band-pass filter elements 20 is connected to the antenna 310 side, and television signals in specific frequency bands are selected by the band-pass filter elements 20 and then output from the output side of the band-pass filter elements 20.

The band-pass filter device 10 according to an embodiment described above with reference to FIGS. 1 to 17 and the like is used as the band-pass filter device 10.

The television tuner 300 according to an embodiment has the band-pass filter device 10 according to an embodiment. Thus, as compared with the external band-pass filter device formed by the LC circuit in related art, the band-pass filter device 10 for a wide frequency band is formed on one substrate.

An embodiment of a television receiver will next be described in the following.

A television receiver according to an embodiment has a television tuner according to an embodiment.

Specifically, the television receiver has the television tuner described with reference to FIG. 25, the television tuner having a plurality of switches for selecting television signals received by an antenna and a band-pass filter device provided so as to correspond to the switches. A band-pass filter device 10 according to an embodiment is used as the band-pass filter device used in the above-described television tuner.

Thus, because the above-described television receiver has the television tuner according to an embodiment, as compared with the television tuner having the external band-pass filter device formed by the LC circuit in related art, a band-pass filter device for a wide frequency band is formed on one substrate.

Thus, the television receiver can achieve excellent filter characteristics capable of sharp attenuation in a very wide frequency range. The television receiver has another advantage of being able to greatly reduce the noise of a received channel, and perform high-quality reception.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A band-pass filter device comprising:
a plurality of band-pass filter elements on a principal plane of a substrate;
wherein said band-pass filter elements correspond to a plurality of respective channels divided by frequency regions, and each have a plurality of piezoelectric resonators, and
each of said piezoelectric resonators includes
a piezoelectric film whose periphery is supported by said substrate,
a first electrode formed on a lower surface of said piezoelectric film,
a second electrode formed on an upper surface of said piezoelectric film and formed in a state of overlapping at least a part of said first electrode with said piezoelectric film interposed between said second electrode and said first electrode,
a lower space formed between said substrate and said piezoelectric film, and
an upper space formed over said piezoelectric film,
said band-pass filter elements have a plurality of band-pass filter element groups,
each band-pass filter element of one of said plurality of band-pass filter element groups has a plurality of piezoelectric resonators, and a piezoelectric film of each piezoelectric resonator has a resonance mode of a different frequency by being changed in length in a one-dimensional direction parallel with the principal plane of said substrate, and
each band-pass filter element of another of said plurality of band-pass filter element groups has a plurality of piezoelectric resonators, and a piezoelectric film of each piezoelectric resonator has a resonance mode of a different frequency by being changed in length in two-dimensional directions parallel with the principal plane of said substrate.

2. The band-pass filter device according to claim 1, wherein
each band-pass filter element of one of said plurality of band-pass filter element groups has a plurality of piezoelectric resonators, and is formed such that width of said piezoelectric film interposed between said first electrode and said second electrode of each piezoelectric resonator is different, and
each band-pass filter element of another of said plurality of band-pass filter element groups has a plurality of piezoelectric resonators, and is formed such that area of said piezoelectric film interposed between said first electrode and said second electrode of each piezoelectric resonator is different.

3. The band-pass filter device according to claim 1, wherein
a first band-pass filter element group as one of said plurality of band-pass filter element groups have a resonance mode corresponding to a UHF band, and
a second band-pass filter element group as another of said plurality of band-pass filter element groups have a resonance mode corresponding to a VHF band.

4. The band-pass filter device according to claim 1, wherein
each of said band-pass filter elements has a ladder type circuit and a lattice type circuit sequentially cascaded from a receiving side.

5. The band-pass filter device according to claim 1, wherein
a resonator element of the piezoelectric resonators forming said band-pass filter elements is formed by an aggregate of a plurality of micro-resonator elements.

6. The band-pass filter device according to claim 1, wherein
frequency bands of said plurality of band-pass filter elements are set consecutively, and
said band-pass filter device has a voltage applying source for applying, to a band-pass filter element channel-selected from said band-pass filter elements, a voltage for varying the frequency band of the band-pass filter element in a frequency range corresponding to $\pm\frac{1}{2}$ of a channel bandwidth.

7. The band-pass filter device according to claim 6, wherein
said voltage applying source is connected to one of said first electrode and said second electrode, and the applied voltage is controlled by an electric series voltage to said piezoelectric film.

8. A band-pass filter device comprising:
a plurality of band-pass filter elements on a principal plane of a substrate;
wherein said band-pass filter elements correspond to a plurality of respective channels divided by frequency regions, and each have a plurality of piezoelectric resonators, and
each of said piezoelectric resonators includes
a piezoelectric film whose periphery is supported by said substrate,
a first electrode formed on a lower surface of said piezoelectric film,
a second electrode formed on an upper surface of said piezoelectric film and formed in a state of overlapping at least a part of said first electrode with said piezoelectric film interposed between said second electrode and said first electrode,
a lower space formed between said substrate and said piezoelectric film, and
an upper space formed over said piezoelectric film, wherein the piezoelectric film of each said piezoelectric resonator is made of a laminated film formed by laminating a tensile stress film and a compressive stress film, and said band-pass filter elements in different resonance modes are sequentially arranged from a low-frequency side to a high-frequency side of channel frequencies and from a region of a large fractional bandwidth to a region of a small fractional bandwidth of channels in decreasing order of an electromechanical coupling factor specific to each resonance mode.

9. A band-pass filter device comprising:
a plurality of band-pass filter elements on a principal plane of a substrate;
wherein said band-pass filter elements correspond to a plurality of respective channels divided by frequency regions, and each have a plurality of piezoelectric resonators, and
each of said piezoelectric resonators includes
a piezoelectric film whose periphery is supported by said substrate,
a first electrode formed on a lower surface of said piezoelectric film,
a second electrode formed on an upper surface of said piezoelectric film and formed in a state of overlapping at least a part of said first electrode with said piezoelectric film interposed between said second electrode and said first electrode,
a lower space formed between said substrate and said piezoelectric film, and
an upper space formed over said piezoelectric film,
each of said band-pass filter elements has a ladder type circuit and a lattice type circuit sequentially cascaded from a receiving side, wherein
fractional bandwidth of a channel is varied continuously according to frequency of said channel, and
a frequency difference between antiresonance frequency of a series resonator element of said ladder type circuit and said lattice type circuit and resonance frequency of a shunt resonator element is increased as the frequency of the channel is varied from a low-frequency side to a high-frequency side.

10. A band-pass filter device comprising:
a plurality of band-pass filter elements on a principal plane of a substrate;
wherein said band-pass filter elements correspond to a plurality of respective channels divided by frequency regions, and each have a plurality of piezoelectric resonators, and
each of said piezoelectric resonators includes
a piezoelectric film whose periphery is supported by said substrate,
a first electrode formed on a lower surface of said piezoelectric film,
a second electrode formed on an upper surface of said piezoelectric film and formed in a state of overlapping at least a part of said first electrode with said piezoelectric film interposed between said second electrode and said first electrode,
a lower space formed between said substrate and said piezoelectric film, and
an upper space formed over said piezoelectric film,
each of said band-pass filter elements has a ladder type circuit and a lattice type circuit sequentially cascaded from a receiving side, wherein
for resonator element capacitance of the piezoelectric resonators forming said band-pass filter elements,
a ratio between series capacitance and shunt capacitance of a piezoelectric resonator element of said lattice type circuit is fixed at one, and
a ratio between series capacitance and shunt capacitance of said ladder type circuit is varied.

11. A band-pass filter device comprising:
a plurality of band-pass filter elements on a principal plane of a substrate;
wherein said band-pass filter elements correspond to a plurality of respective channels divided by frequency regions, and each have a plurality of piezoelectric resonators, and
each of said piezoelectric resonators includes
a piezoelectric film whose periphery is supported by said substrate,
a first electrode formed on a lower surface of said piezoelectric film,
a second electrode formed on an upper surface of said piezoelectric film and formed in a state of overlapping at least a part of said first electrode with said piezoelectric film interposed between said second electrode and said first electrode,
a lower space formed between said substrate and said piezoelectric film, and
an upper space formed over said piezoelectric film,
a resonator element of the piezoelectric resonators forming said band-pass filter elements is formed by an aggregate of a plurality of micro-resonator elements, wherein
letting Co be capacitance of said micro-resonator elements, fo be a center frequency of said band-pass filter elements, and Z be matching impedance of said band-pass filter, a number N of said micro-resonator elements is $N=1/(2\pi \times fo \times Co \times Z)$.

12. The band-pass filter device according to claim 11, wherein said N is an integer.

13. A method of manufacturing a band-pass filter, said method comprising:
forming a band-pass filter element by forming a plurality of piezoelectric resonators on a principal plane of a substrate, and forming a plurality of said band-pass filter elements;
forming each of said piezoelectric resonators including the steps of
forming a first sacrifice layer on said substrate,
forming a first electrode so as to cover a part of said first sacrifice layer,
forming a piezoelectric film to cover said first electrode and said first sacrifice layer, and
forming a second electrode so as to cover a part of said piezoelectric film, said second electrode having a part overlapping said first electrode with said piezoelectric film interposed between said second electrode and said first electrode;
forming a first through hole to communicate with the first sacrifice layer formed between said substrate and said piezoelectric film after forming said piezoelectric film or after forming said second electrode;
forming a second sacrifice layer to cover said second electrode on said piezoelectric film after forming said first through hole;
forming an upper space forming film to cover said second sacrifice layer;
forming a second through hole to communicate with the second sacrifice layer formed between said piezoelectric film and said upper space forming film after forming said upper space forming film; and removing said first sacrifice layer through said first through hole, and removing said second sacrifice layer through said second through hole, said band-pass filter elements have a plurality of band-pass filter element groups, each band-pass filter element of one of said plurality of band-pass filter element groups has a plurality of piezoelectric resonators, and a piezoelectric film of each piezoelectric resonator has a resonance mode of a different frequency by being changed in length in a one-dimensional direction parallel with the principal plane of said substrate, and each band-pass filter element of another of said plurality of band-pass filter element groups has a plurality of piezoelectric resonators, and a piezoelectric film of each piezoelectric resonator has a resonance mode of a different frequency by being changed in length in two-dimensional directions parallel with the principal plane of said substrate.

14. A television tuner comprising:

a plurality of switches for selecting a television signal received by an antenna; and a band-pass filter device disposed so as to correspond to each of said switches;

wherein said band-pass filter device includes a plurality of band-pass filter elements on a principal plane of a substrate, said band-pass filter elements correspond to a plurality of respective channels divided by frequency regions, and each have a plurality of piezoelectric resonators, and each of said piezoelectric resonators includes a piezoelectric film whose periphery is supported by said substrate, a first electrode formed on a lower surface of said piezoelectric film, a second electrode formed on an upper surface of said piezoelectric film and formed in a state of overlapping at least a part of said first electrode with said piezoelectric film interposed between said second electrode and said first electrode, a lower space formed between said substrate and said piezoelectric film, and an upper space formed over said piezoelectric film, said band-pass filter elements have a plurality of band-pass filter element groups, each band-pass filter element of one of said plurality of band-pass filter element groups has a plurality of piezoelectric resonators, and a piezoelectric film of each piezoelectric resonator has a resonance mode of a different frequency by being changed in length in a one-dimensional direction parallel with the principal plane of said substrate, and each band-pass filter element of another of said plurality of band-pass filter element groups has a plurality of piezoelectric resonators, and a piezoelectric film of each piezoelectric resonator has a resonance mode of a different frequency by being changed in length in two-dimensional directions parallel with the principal plane of said substrate.

15. A television receiver comprising:

a television tuner including a plurality of switches for selecting a television signal received by an antenna and a band-pass filter device disposed so as to correspond to each of said switches;

wherein said band-pass filter device includes a plurality of band-pass filter elements on a principal plane of a substrate, said band-pass filter elements correspond to a plurality of respective channels divided by frequency regions, and each have a plurality of piezoelectric resonators, and each of said piezoelectric resonators includes a piezoelectric film whose periphery is supported by said substrate, a first electrode formed on a lower surface of said piezoelectric film, a second electrode formed on an upper surface of said piezoelectric film and formed in a state of overlapping at least a part of said first electrode with said piezoelectric film interposed between said second electrode and said first electrode, a lower space formed between said substrate and said piezoelectric film, and an upper space formed over said piezoelectric film, said band-pass filter elements have a plurality of band-pass filter element groups, each band-pass filter element of one of said plurality of band-pass filter element groups has a plurality of piezoelectric resonators, and a piezoelectric film of each piezoelectric resonator has a resonance mode of a different frequency by being changed in length in a one-dimensional direction parallel with the principal plane of said substrate, and each band-pass filter element of another of said plurality of band-pass filter element groups has a plurality of piezoelectric resonators, and a piezoelectric film of each piezoelectric resonator has a resonance mode of a different frequency by being changed in length in two-dimensional directions parallel with the principal plane of said substrate.

* * * * *